(12) United States Patent
Chang-Hasnain et al.

(10) Patent No.: US 8,059,690 B2
(45) Date of Patent: Nov. 15, 2011

(54) SUB-WAVELENGTH GRATING INTEGRATED VCSEL

(75) Inventors: Connie J. Chang-Hasnain, Palo Alto, CA (US); Michael Chung-Yi Huang, Taipei (TW); Ye Zhou, Shanghai (CN); Carlos Fernando Rondina Mateus, San Jose de Campos (BR)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/795,643

(22) Filed: Jun. 7, 2010

(65) Prior Publication Data
US 2010/0316079 A1 Dec. 16, 2010

Related U.S. Application Data

(60) Division of application No. 11/438,480, filed on May 19, 2006, now abandoned, which is a continuation-in-part of application No. PCT/US2005/001416, filed on Jan. 14, 2005.

(60) Provisional application No. 60/536,570, filed on Jan. 14, 2004.

(51) Int. Cl.
*H01S 5/00* (2006.01)
(52) U.S. Cl. ........... 372/50.124; 372/50.121; 372/50.11; 372/50.1
(58) Field of Classification Search ............. 372/50.124, 372/50.121, 50.11, 50.1
See application file for complete search history.

(56) References Cited

U.S. PATENT DOCUMENTS

| | | | |
|---|---|---|---|
| 6,005,835 A | 12/1999 | Tsuji et al. | |
| 6,035,089 A | 3/2000 | Grann et al. | |
| 6,597,721 B1 * | 7/2003 | Hutchinson et al. | ........... 372/98 |
| 6,611,377 B1 | 8/2003 | Chung | |
| 6,836,501 B2 | 12/2004 | Cox et al. | |
| 6,853,669 B2 | 2/2005 | Simpson et al. | |
| 7,167,615 B1 | 1/2007 | Wawro et al. | |
| 7,190,657 B2 | 3/2007 | Shin et al. | |
| 7,280,230 B2 | 10/2007 | Shchegrov et al. | |
| 7,304,781 B2 | 12/2007 | Chang-Hasnain et al. | |

(Continued)

FOREIGN PATENT DOCUMENTS
WO 2005089098 A2 9/2005

OTHER PUBLICATIONS

ISA/US, International Search Report, PCT/US2005/001416, issued Dec. 16, 2005.

*Primary Examiner* — Kinam Park
(74) *Attorney, Agent, or Firm* — John P. O'Banion

(57) ABSTRACT

A vertical cavity surface emitting laser (VCSEL) is described using a sub-wavelength grating (SWG) structure that has a very broad reflection spectrum and very high reflectivity. The grating comprises segments of high and low refractive index materials with an index differential between the high and low index materials. By way of example, a SWG reflective structure is disposed over a low index cavity region and above another reflective layer (either SWG or DBR). In one embodiment, the SWG structure is movable, such as according to MEMS techniques, in relation to the opposing reflector to provide wavelength selective tuning. The SWG-VCSEL design is scalable to form the optical cavities for a range of SWG-VCSELs at different wavelengths, and wavelength ranges.

20 Claims, 17 Drawing Sheets

U.S. PATENT DOCUMENTS

| | | |
|---|---|---|
| 2002/0000244 A1 | 1/2002 | Zaidi |
| 2004/0109483 A1* | 6/2004 | Simpson et al. ............... 372/39 |
| 2004/0156590 A1 | 8/2004 | Gunn et al. |
| 2006/0024013 A1* | 2/2006 | Magnusson et al. .......... 385/129 |
| 2006/0181704 A1 | 8/2006 | Cunningham et al. |
| 2007/0014515 A1 | 1/2007 | Sugawara et al. |
| 2007/0035847 A1 | 2/2007 | Li et al. |
| 2007/0153860 A1 | 7/2007 | Chang-Hasnain et al. |

\* cited by examiner

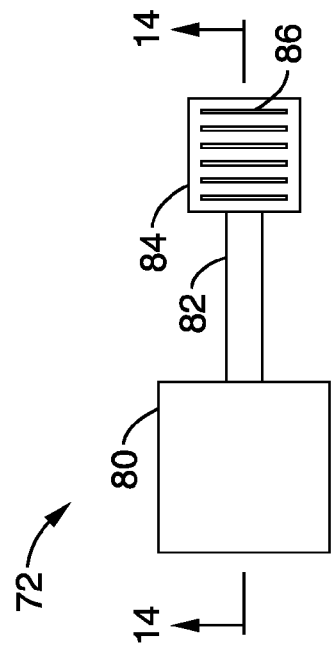
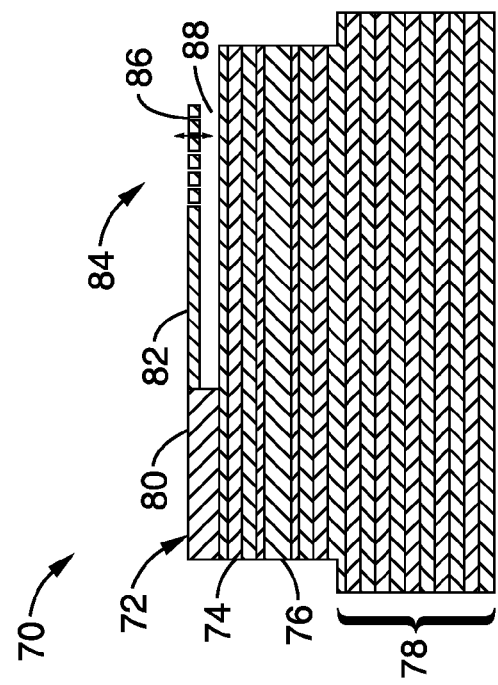
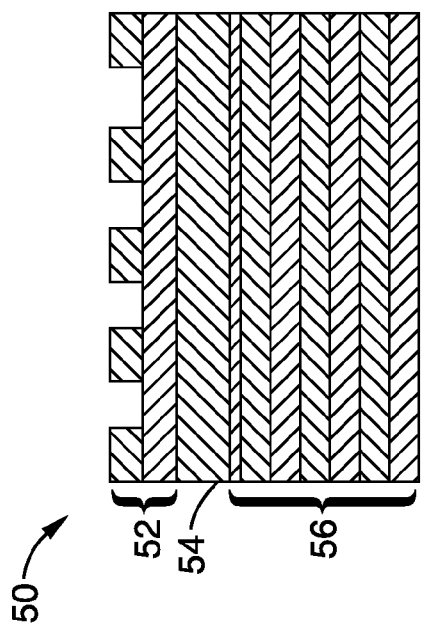
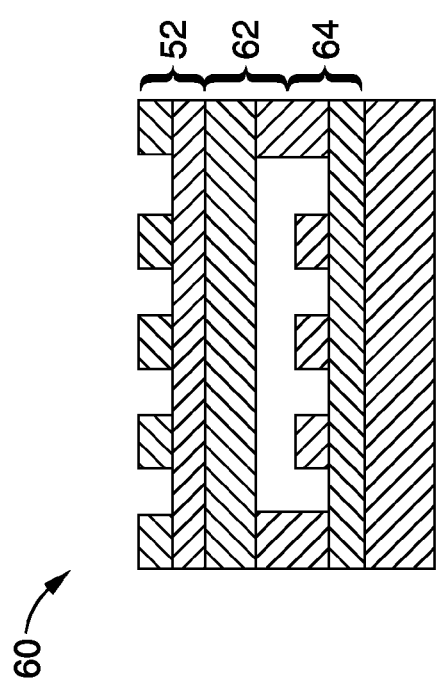

SUB-WAVELENGTH GRATING INTEGRATED VCSEL

CROSS-REFERENCE TO RELATED APPLICATIONS

This application is a division of U.S. patent application Ser. No. 11/438,480 filed on May 19, 2006, incorporated herein by reference in its entirety, which is a 35 U.S.C. §111(a) continuation-in-part of PCT international application serial number PCT/US2005/001416, filed on Jan. 14, 2005, incorporated herein by reference in its entirety, which claims priority from U.S. provisional application Ser. No. 60/536,570 filed on Jan. 14, 2004, incorporated herein by reference in its entirety.

This application is related to PCT International Publication Number WO 2005/089098 A2, published on Sep. 29, 2005, incorporated herein by reference in its entirety.

This application is related to U.S. Pat. No. 7,304,781 issued on Dec. 4, 2007, incorporated herein by reference in its entirety.

STATEMENT REGARDING FEDERALLY SPONSORED RESEARCH OR DEVELOPMENT

This invention was made with Government support under a grant from DARPA (Center for Bio-Optoelectronic Sensor Systems [BOSS]), Contract No. MDA9720010020. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to broadband mirrors, and more particularly to high reflectivity gratings.

2. Description of Related Art

Semiconductor light emitting diodes and lasers are used in a wide range of applications, such as telecommunication, display, solid-state lighting, sensing, surveillance and imaging. For many of these applications it is desirable to have devices having light emission normal to the surface of the wafer. The surface emitting topology facilitates array fabrication, integration with other devices and wafer-scale testing during and after processing. One form of these light emitting devices requires integration of mirrors with high reflectivity. Broadband mirrors ($\Delta\lambda/\lambda > 15\%$) with very high reflectivity (R>99%) are essential for numerous applications, including telecommunications, surveillance, sensors and imaging, ranging from 0.7 μm to 12 μm wavelength regimes. For example, in optical integrated circuits, electro-optic modulators play an important role in switching and signal encoding. Ideally, electro-optic modulators have low insertion loss and wide bandwidth. Mirrors are key components and the performance of many modulators would be substantially improved if they incorporated a low insertion loss, broad bandwidth, mirror. In the case of surface-emitting semiconductor light-emitting diodes and lasers, the broadband mirrors are required in the construction of optical cavity resonators to achieve large quality (Q) factors.

Among the candidates for mirrors are metal mirrors and dielectric mirrors. Metal mirrors have comparatively large reflection bandwidths but lower reflectivities (R), as they are limited by absorption loss. As a result, they are not suitable for fabricating transmission-type optical devices such as etalon filters.

Dielectric mirrors on the other hand have a lower loss than metal mirrors and therefore can achieve a higher reflectivity. However, the available deposition methods are often not precise enough to readily provide these high reflectivities. It should be appreciated that dielectric mirrors are composed of multi-layer dielectric materials with different dielectric indices. Distributed Bragg Reflectors (DBR) consist of multiple periods of alternating high and low refractive index layers. The tuning range for a tunable filter made with DBR mirrors is determined by the DBR mirror bandwidth and the maximum allowable mechanical movement, whichever is smaller. These mirrors have low absorption loss, but the modulation depth, bandwidth and band location depend on the refractive index contrast of the constituent materials as well as on the control over the layer thickness.

In order to minimize interface disorder and strain in the multilayer structures, typical combinations of materials often have small refractive index differences, thus resulting in very limited bandwidths ($\Delta\lambda/\lambda \approx 3\text{-}9\%$). As a result of this narrow bandwidth, the tuning range of electro-optic modulators, such as etalon type devices, has been severely limited.

For tunable etalon type devices, such as micro-electro-mechanical (MEM) vertical cavity surface emitting lasers (VCSEL), filters and detectors, the tuning range is often limited by semiconductor based distributed Bragg reflectors (DBRs) to $\Delta\lambda/\lambda \approx 3\text{-}9\%$. Conventional designs have not provided a mirror with broadband reflection, low loss and compatibility with optoelectronic processing. Semiconductor-based DBRs have been widely used for vertical cavity surface emitting lasers (VCSEL), detectors, and filters because of their higher thermal and electrical conductivities. A typical VCSEL requires an optical resonant cavity having two DBRs, wherein one DBR is positioned on each side of a cavity layer. In the center of the cavity layer resides an active region. In one implementation the active region comprises at least one layer of quantum wells or quantum dots. Current is injected into the active region through a current guiding structure such as provided by either an oxide aperture or proton-implanted surroundings. The laser emission wavelength of the structure is determined by the Fabry-Perot resonance wavelength of the cavity and DBRs, as well as the active region gain bandwidth. The use of semiconductor DBRs within devices limits the emission wavelength, wherein a mirror with high reflectivity and broad bandwidth is desired.

One of the major difficulties in the current status of VCSEL fabrication, especially for long wavelength components around 1.55 μm regimes, concerns the realization of high quality reflective p-type VCSEL mirror. This fabrication difficulty is primarily a result of the limited choice of materials available for the material growth process. In conventional semiconductor-based DBR (e.g., $Al_xGa_{1-x}As$) devices, the refractive index contrast is low, such as somewhere between the high and low index material. Consequently, an excess number of DBR pairs is required to achieve >99% reflectivity, thus increasing the difficulty in achieving high quality material growth. This has been a major bottleneck for 1.3-1.55 µm VCSEL fabrication and remains a problem for blue-green and 2-3 µm wavelength regimes. The shortcomings of this prior approach are even more pronounced with regard to the fabrication of wavelength-tunable VCSELs, in which the requirements on mirror bandwidth and reflectivity become even more stringent.

Accordingly, there is a need for vertical cavity surface emitting lasers which can be readily fabricated across a range of wavelengths as well as for wavelength-tunable devices. The present invention satisfies that need, as well as others, and generally overcomes the limitations of the art.

BRIEF SUMMARY OF THE INVENTION

The present invention generally comprises a sub-wavelength grating reflector utilized in a novel optical resonator cavity that has application in a number of optical devices. An embodiment of one such device is described as a vertical cavity surface emitting laser (VCSEL) that utilizes a monolithic integrated highly-reflective sub-wavelength grating in its optical resonator cavity. In contrast to conventional distributed Bragg reflectors, these sub-wavelength gratings offer superior optical performance and simplicity of fabrication. The sub-wavelength grating can be scaled to form an optical cavity for VCSELs at different operating wavelengths and can be adapted to different material systems. To achieve an extraordinarily broad bandwidth, the sub-wavelength grating is configured to provide a large index contrast surrounding the high index grating segments, particularly the layer below the lines, which marks the major difference from conventional grating design. The embodiments according to the invention can be fabricated on either planar or curved surfaces. For example, the sub-wavelength grating reflector can be fabricated upon curved optical lenses.

The structure of the sub-wavelength grating generally comprises a one dimensional grating structure with lines made of high refractive index material sandwiched between two low refractive index materials on top and bottom. The index difference between the high and low index materials determines the bandwidth and modulation depth. The larger difference in refractive indices gives rise to wider reflection bands. The reflection is sensitive to parameters such as the grating period, the grating thickness, the duty cycle of the grating, the refractive index and the thickness of the low index layer underneath the grating.

Several examples are provided to illustrate the functionality of the sub-wavelength grating reflector. The bandwidth of a reflector is defined by the stopband wavelength range over the center wavelength ($\Delta\lambda/\lambda$) for a given minimum reflectivity (e.g., R>99%). Typical bandwidth of distributed Bragg Reflector has a bandwidth of $\Delta\lambda/\lambda\approx3$-9%. In contrast to this, one example embodiment of sub-wavelength grating according to the present invention describes a reflector with R>99% with $\Delta\lambda/\lambda$>30% for a wavelength range centered at 1.55 µm.

Micro-electro-mechanical systems (MEMS) provide a simple wavelength tuning mechanism for many optoelectronic devices. The major advantages of MEMS-based tunable filters include a large tuning range, continuous tuning with high precision, a narrow passband and a fast response time (1-10 microseconds). The concept is based on scanning Fabry-Perot (FP) etalon with an integrated MEMS drive to provide precise physical change of the cavity length. A conventional etalon comprises two mirrors separated by a cavity gap. The filter can be tuned by moving one of the mirrors relative to the other, thus changing the dimensions of the air gap. Thus, conventional MEMS-based tunable filters have the advantage of continuous tuning in that variation of the etalon gap size results in the variation in the transmission wavelength. However, existing filters have a limited tuning range ($\Delta\lambda/\lambda\sim7\%$) with mechanical structures which are difficult to fabricate and which have a small optical fill factor. The present invention provides a tunable filter using sub-wavelength grating structures as the reflectors that provide a much larger tuning range ($\Delta\lambda/\lambda>30\%$) in the far-infrared wavelength (FIR) regime. It will be seen that the MEMS-based optical filter design is flexible and can be scaled to a wide range of wavelengths by simply changing the dimensions of the reflectors. The design also provides a large optical fill factor over existing designs that will permit the fabrication of two-dimensional arrays that require reasonably low driving voltages.

The simplicity and versatility of the SWG mirror design facilitates the monolithic integration with a VCSEL, and eventually a tunable VCSEL, for a wide range of wavelengths from visible to far infrared. Furthermore, such a configuration of MEMS tunable VCSEL can potentially increase resonant frequency and tuning range with reduced actuation power.

The invention is amenable to being embodied in a number of ways, including but not limited to the following descriptions.

One embodiment of the invention can be generally described as an apparatus for a sub-wavelength grating reflector, comprising: (a) a first layer of low refractive index material; (b) a plurality of periodically spaced apart segments (i.e., 1D array of segments, bars or other structures) of high refractive index material on said layer of low refractive index material; and (c) a second layer of low refractive index material on said segments of high refractive index material.

The grating structure described can be fabricated on surfaces having any shape or form. By way of example, surfaces can be planar, curved, or have more complex geometries depending on the application. Other devices can be fabricated using the novel grating structure including both passive and active devices. Passive optical elements can be fabricated, such as lenses, mirrors, filters and the like. Active optical devices can be fabricated, such as optical emitters, optical detectors, optical filters, optical power devices and the like. By way of example, the grating structure can be utilized to fabricate photovoltaic cells (solar cells) and so forth.

It should be appreciated that the second layer of low refractive index material is disposed between said segments of high index material. The second layer of low refractive index material can comprise air, or any other desired low index material. The segments of high refractive index material can comprise a Group III-V compound, a Group VI element, organic polymers, and other materials which provide sufficient refractive index differential.

One implementation of the invention teaches an optical resonator cavity, comprising: (a) a first sub-wavelength grating reflector configured with a plurality of periodically spaced segments of high refractive index material over a low refractive index material, the combination forming a first reflector; and (b) a distributed Bragg reflector retained substantially parallel to said first reflector. The distributed Bragg reflector in this implementation is sufficiently separated from said first sub-wavelength grating reflector to form a cavity resonator region between said sub-wavelength grating reflector and said distributed Bragg reflector.

Within the optical resonator cavity is retained a plurality of semiconductor quantum structures within an active region of the resonant cavity. These quantum structures can comprise quantum wells, or quantum wires, or quantum dots, or any combination of quantum wells, quantum wires, and quantum dots, or other quantum structures. Embodiments can be additionally, or alternatively, configured with a plurality of semiconductor quantum structures within the plurality of segments of high refractive index material.

A vertical cavity surface emitting laser (VCSEL), as well as other devices, can incorporate the optical resonator. Similarly, a light emitting diode (LED) can be fabricated, by way of example, based on stimulated emission with amplification but having insufficient feedback for oscillation to build up. The VCSEL can be formed with an external cavity resonator. Other devices can be fabricated using the novel resonant cavity such as optical emitters, optical detectors, optical filters, optical power devices and other resonant optical devices.

The vertical cavity can be tuned by a means for moving the first sub-wavelength grating reflector in relation to the distributed Bragg reflector. By way of example, a MEMS device can be utilized for moving the first sub-wavelength grating reflector in relation to the distributed Bragg reflector.

One implementation of the invention teaches a surface emitting optical device cavity, comprising: (a) a first sub-wavelength grating (SWG) reflector configured with a plurality of periodically spaced segments of high refractive index material over a layer of low refractive index material; and (b) a distributed Bragg reflector (DBR) substantially parallel to the first reflector. The distributed Bragg reflector is separated from the first sub-wavelength grating reflector by a predetermined distance to form a resonant cavity.

A plurality of semiconductor quantum structures are retained within the resonant cavity, and/or within the high refractive material of the sub-wavelength grating. These structures can be selected from the group of quantum structures consisting essentially of quantum wells, quantum wires and quantum dots. A micro-electro-mechanical system (MEMS), or other motion inducing means, can be coupled to the sub-wavelength grating reflector to move it in relation to the opposing reflector therein changing the wavelength of the device.

One implementation of the invention teaches a surface emitting vertical-cavity surface emitting laser device, comprising: (a) a first sub-wavelength grating (SWG) reflector configured with a plurality of periodically spaced segments of high refractive index material over a layer of low refractive index material forming a first reflector; (b) a first distributed Bragg reflector (DBR) configured with a plurality of alternating layers of high and low refractive index materials; (c) wherein the first distributed Bragg reflector is retained substantially parallel to the first reflector to form a second reflector; (d) a resonant cavity of predetermined depth formed between the first reflector and the second reflector; (e) means for optical confinement between the first and second reflectors; and (f) means for current injection.

The vertical-cavity surface emitting laser device can optionally include means for changing the distance between the first sub-wavelength grating and the first distributed Bragg reflector to form a wavelength variable vertical-cavity surface emitting laser device. The vertical-cavity surface emitting laser device can also include at least one reflective protective layer between the first sub-wavelength grating reflector and the resonant cavity. The reflective protective layer preferably comprises a second distributed Bragg reflector having fewer layers than the first distributed Bragg reflector. The second distributed Bragg reflector is preferably p-doped in the case of the first distributed Bragg reflector being n-doped, or n-doped in the case of the first distributed Bragg reflector being p-doped.

The means for current injection comprises a first contact electrode coupled to the second distributed Bragg reflector or the first sub-wavelength grating, and a second contact electrode coupled to the first distributed Bragg reflector. In one implementation the means for optical confinement comprises an in-plane aperture through a portion of the resonant cavity configured to provide optical confinement. A plurality of semiconductor quantum structures can be contained within an active region that forms the resonant cavity. Depending on the application, the quantum structures can be additionally or alternatively contained in the segments of high index material. In this device the index difference between the high index material and the low index material within the first sub-wavelength grating (SWG) reflector determine the bandwidth and modulation depth of the vertical-cavity surface emitting laser device.

Embodiments of the present invention can provide a number of beneficial aspects which can be implemented either separately or in any desired combination without departing from the present teachings.

An aspect of the invention is to provide an ultra-broadband mirror using a high refractive index material grating and a layer of low refractive index material under the grating.

Another aspect of the invention is a sub-wavelength grating reflector having a substrate layer, a layer of low refractive index material disposed on the substrate layer, and a plurality of spaced apart segments of high refractive index material on the layer of low refractive index material.

Another aspect of the invention is a sub-wavelength grating reflector that can be readily fabricated planar and curved configurations.

Another aspect of the invention is a sub-wavelength grating reflector that can be incorporated within both passive and active optical devices.

Another aspect of the invention is to provide a sub-wavelength grating reflector where there is a large differential between the index of refraction of the high refractive index segments and the layer of low refractive index material, preferably exceeding one unit.

Another aspect of the invention is to provide an etalon filter having a first sub-wavelength grating reflector and a second sub-wavelength grating reflector that is substantially parallel to the first reflector and separated by a gap and the first and second reflectors comprise a plurality of bands of a high refractive index material disposed on a layer of a low index material.

Another aspect of the invention is to provide an etalon filter with a means for moving the first reflector relative to the second reflector using any desired MEMS technology.

Another aspect of the invention is to provide a sub-wavelength grating reflector that can be manufactured with a variety of materials including semiconductors, dielectric materials, metals, Group IV elements, Group III-V compounds, Group II-VI compounds and organic polymers.

Another aspect of the invention is to provide an etalon filter that has a large fill factor and operates at reduced voltages compared to existing filters.

Another aspect of the invention is to provide a cavity structure for a surface-emitting device.

Another aspect of the invention is to provide SWG-VCSEL devices (e.g., lasers and light emitting diodes) which can be readily fabricated across a range of wavelengths, including extending in either direction into the both the IR and UV range.

Another aspect of the invention is to provide a VCSEL structure utilizing a low index material, such as air.

Another aspect of the invention is to provide a VCSEL structure having a SWG first mirror operating in combination with a DBR second mirror on first and second sides of a cavity.

Another aspect of the invention is to provide a device structure for use on vertical cavity surface emitting lasers, vertical external cavity surface emitting lasers, surface emitting diodes (LEDs), optical detectors, optical filters and so forth within a variety of integrated circuit devices.

Another aspect of the invention is to provide a wavelength selectable device structure for use within integrated circuits.

Still another aspect of the invention is to provide microelectromechanical controllable wavelength selection of optical resonance within an optical device.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWINGS

The invention will be more fully understood by reference to the following drawings which are for illustrative purposes only:

FIG. 11 is a schematic of a vertical cavity surface emitting laser according to an embodiment of the present invention, shown utilizing a combination of SWG and DBR mirror structures.

FIG. 12 is a schematic of a vertical cavity surface emitting laser according to an embodiment of the present invention, shown utilizing two SWG mirror structures.

FIG. 13 is a top view of a cantilevered SWG mirror structure of a wavelength tunable vertical cavity surface emitting laser according to an embodiment of the present invention.

FIG. 14 is a schematic view of the wavelength tunable vertical cavity surface emitting laser of FIG. 13.

DETAILED DESCRIPTION OF THE INVENTION

Referring more specifically to the drawings, for illustrative purposes the present invention is embodied in the apparatus generally shown in FIG. 1 through FIG. 22. It will be appreciated that the apparatus may vary as to configuration and as to details of the parts, and that the method may vary as to the specific steps and sequence, without departing from the basic concepts as disclosed herein.

A broadband mirror with high reflectivity that is suitable for use in applications such as sensors, surveillance, imaging and communications is provided. More particularly, the mirror allows the fabrication of VCSEL devices having a range of wavelengths and/or as wavelength tunable devices. The reflector structure generally comprises a grating with periodic lines of high and low index material disposed on a low index material and a substrate. A tunable etalon filter with two reflectors and a variable air gap illustrates one application of the sub-wavelength reflectors of the present invention. The mirror device is scalable so as to operate within the electromagnetic spectrum from visible to infra-red (IR) and far-infrared (FIR) wavelengths, and from visible to ultra-violet (UV) wavelengths. The mirror device requires low actuation voltages.

Figure 1:
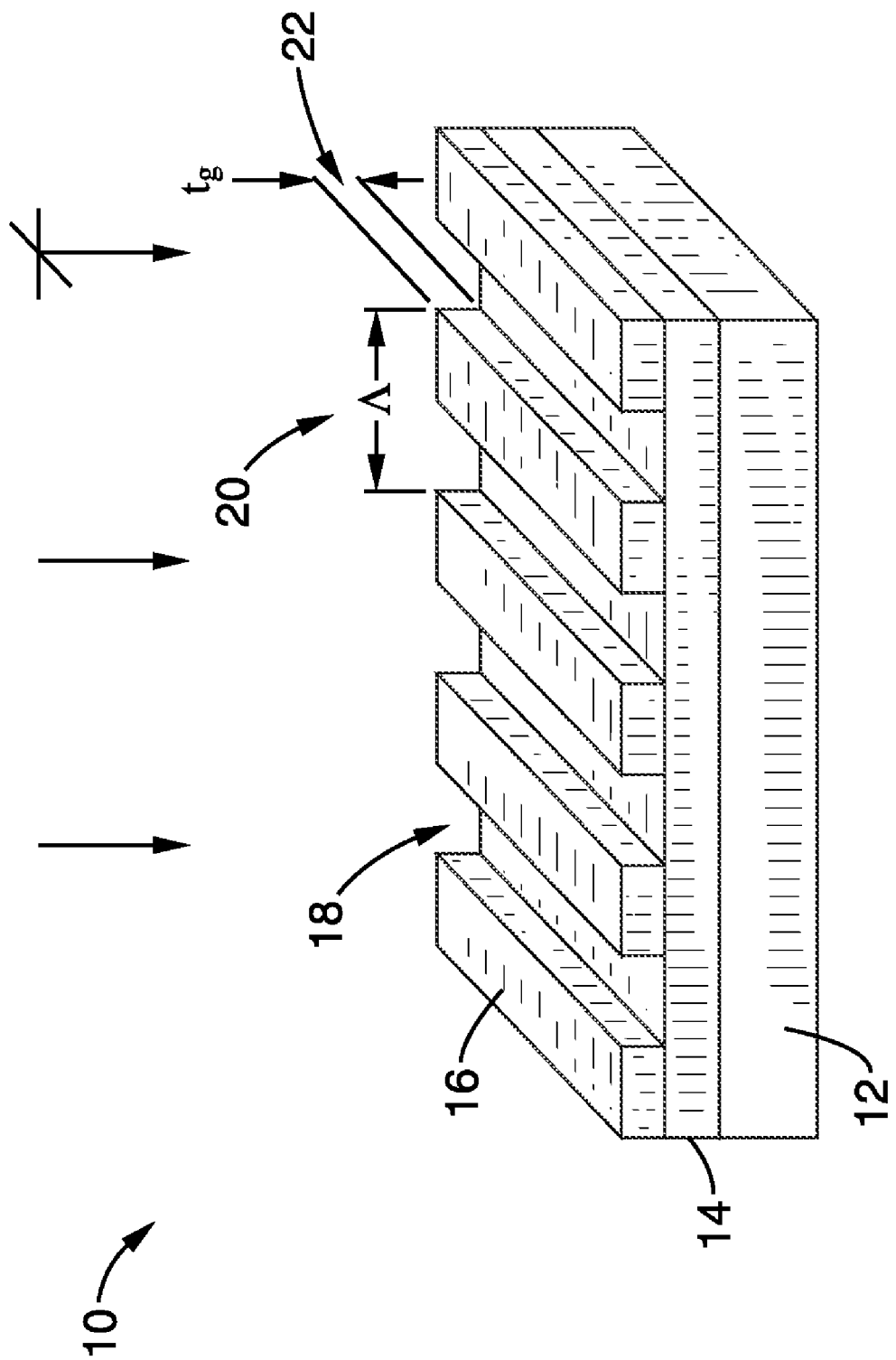
FIG. 1 is a schematic of a sub-wavelength broadband grating reflector according to an embodiment of the present invention.

FIG. 1 illustrates an example grating embodiment 10 comprising a substrate layer 12 composed of silicon, a layer of low index material 14 composed of $SiO_2$ over the substrate layer 12, and a plurality of spaced apart sections of high index material 16, such as comprising a semiconductor material, for instance a poly-silicon material. In this embodiment the spaces 18 which exist between the sections (lines) of high index material 16 are filled with low index material, depicted in this example as air. With the high index material 16 being open to the air a second low index layer is created. Although silicon materials are used as an illustration, it will be understood that many different high and low index materials may be suitably utilized. In general, preferred materials will have a large refractive index difference between the two materials that form the grating, for a targeted specific wavelength range, and the optical absorption/loss for the two materials will be low. The larger the difference between high and low indices, the larger the reflection bandwidth which is achieved. Other suitable combinations of high and low refractive index materials may be selected within the group of materials consisting essentially of various semiconductor materials, dielectric materials and metals. Although the figure represents the grating as fabricated in a planar form, it should be appreciated that it can be fabricated in curves and other non-planar forms.

Specific examples of these materials include C; Si; Ge; SiGe; various Group III-V compounds such as $In_xGa_yAl_{1-x-y}As_zP_mSb_{1-z-m}$, [where x, y, m, z are all between 0 and 1]; InGaAsNSb; various Group II-VI compounds (ZnCdSeS with various combinations). Examples of metal materials include Au, Ag, Al, and so forth. Examples of dielectric materials include BN, ZnOx, and similar material having a dielectric property. Examples of other material combinations that may be utilized include $Si/TiO_2$, Si/air, $GaAs/AlO_x$ and $ZnSe/CaF_2$ and the like. Organic polymers may also be used for both high and low refractive index materials.

Design parameters for the structure include the materials used (index of refraction), thickness of the low index layer under the grating ($t_L$), the grating period ($\Lambda$), the grating thickness 22 ($t_g$), and the duty cycle. The duty cycle is defined as the ratio of the width of the high index material to the grating period $\Lambda$. The distance between the far edge of one stripe of high index material 16 with the near edge of the adjacent stripe 16 is the grating period 18 ($\Lambda$). Although FIG. 1 describes a uniform grating, it will be understood that the invention will also include nonuniform gratings such as chirped or sampled gratings.

It has been shown that the reflectivity range of the mirror is dependent on the selected grating period 18 ($\Lambda$), the duty cycle and the grating thickness 22 ($t_g$). Accordingly, the sub-wavelength grating 10 (SWG) is scalable for different wavelengths by simply changing its geometrical dimensions. This facilitates the easy fabrication of reflectors which operate at low voltage within widely tunable optical filters of optoelectric devices operating over a wide range of wavelengths, from visible to infrared and far infrared as well as from visible to ultraviolet.

The present invention may be more particularly described in the following examples that are intended for illustrative purposes only, since numerous modifications, adaptations and variations to the apparatus and methods will be apparent to those skilled in the art.

EXAMPLE 1

Figure 2A:
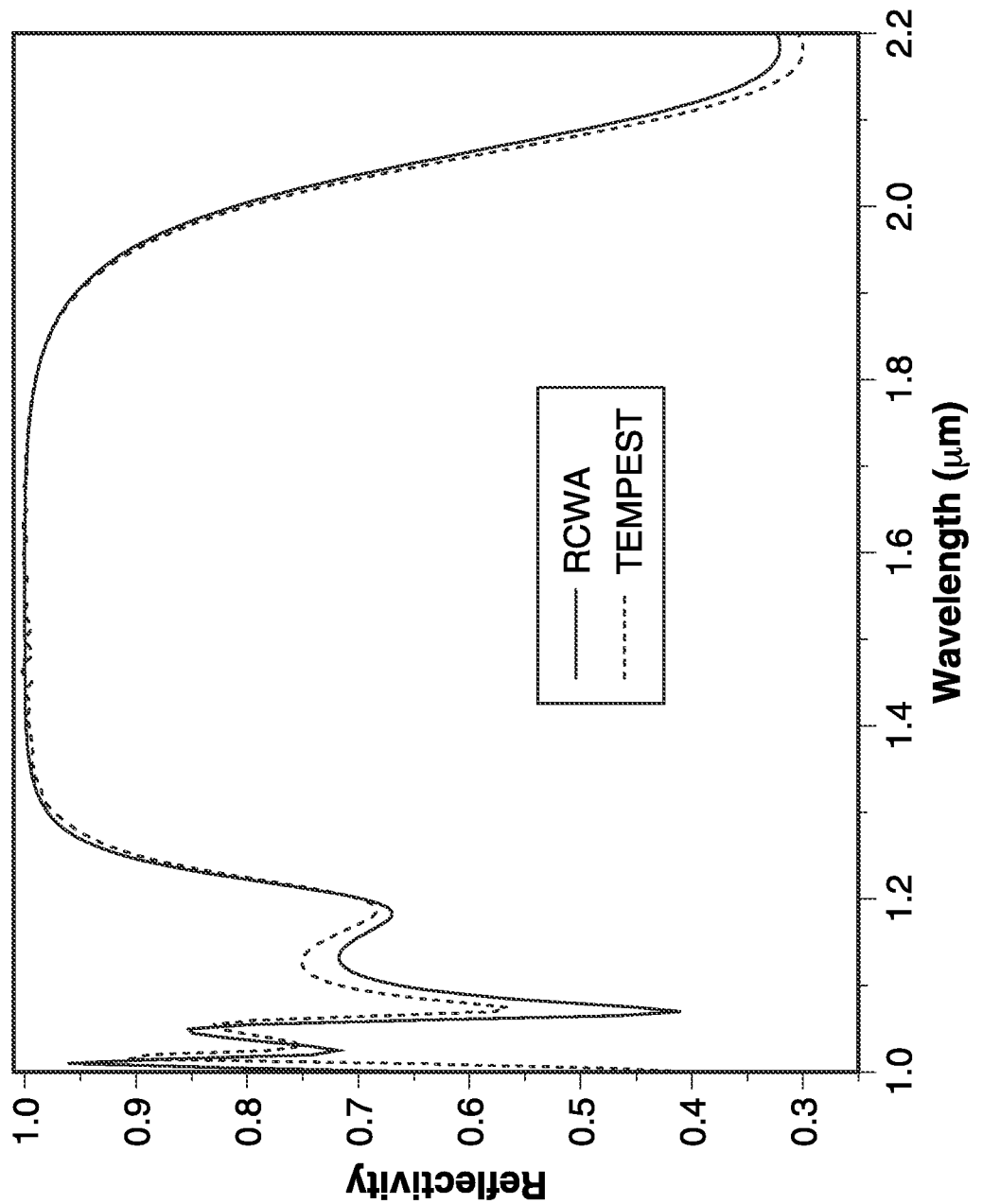
FIG. 2A is a graph of reflectivity versus wavelength for light received perpendicular to the grating lines obtained from RCWA and TEMPEST analysis according to an embodiment of the present invention.

FIG. 2A through FIG. 2D illustrate simulated mirror reflectivity for linear polarized light in the direction perpendicular to the grating lines with results shown as a function of wavelength for the sub-wavelength grating structure shown in FIG. 1. FIG. 2A compares simulated reflectivity using both a Rigorous Coupled Wave Analysis (RCWA) and confirmed by finite difference time domain electromagnetic propagation using TEMPEST®. The two methods are in excellent agreement and both illustrate the broadband and highly reflective properties of the sub-wavelength grating. It can be seen that the sub-wavelength grating provides a very broadband mirror $\Delta\lambda/\lambda>30\%$, with R>0.99, for wavelengths centered around 1.55 μm, over the range 1.33 μm to 1.80 μm, as depicted by FIG. 2A. The reflection bandwidth of the mirror is also very broad for a higher reflectivity R>0.999 (1.40 μm to 1.67 μm or $\Delta\lambda/\lambda>17\%$).

The parameters used in the simulation were: Si substrate (n=3.48), grating period $\Lambda$=0.7 μm, high index material $n_n$=3.48 (Poly-Si), low index material in and above the grating=1 (air), low index material under the grating $n_L$=1.47 (SiO2), grating thickness $t_g$=0.46 μm and grating duty cycle=0.75. The index of refraction was considered constant along the covered range, which provides a very good approximation because most semiconductor materials such as Si, GaAs and ZnSe have an index of refraction practically independent of wavelength in the considered ranges.

Figure 2C:
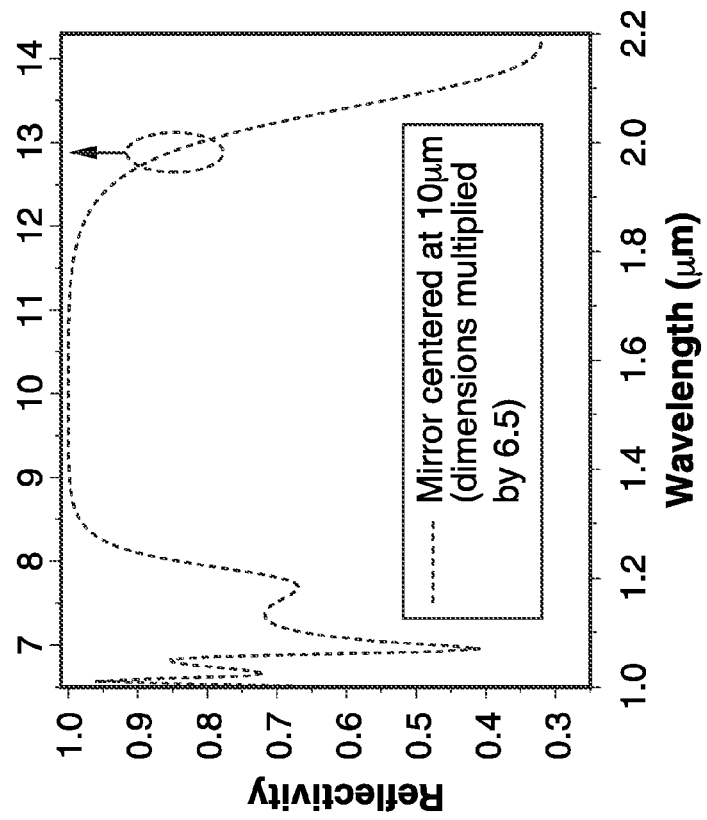
FIG. 2B-2D are graphs illustrating scaling the reflectivity spectrum with wavelength a mirror centered at 1.55 μm and 10 μm according to an aspect of the present invention.
Figure 2B:
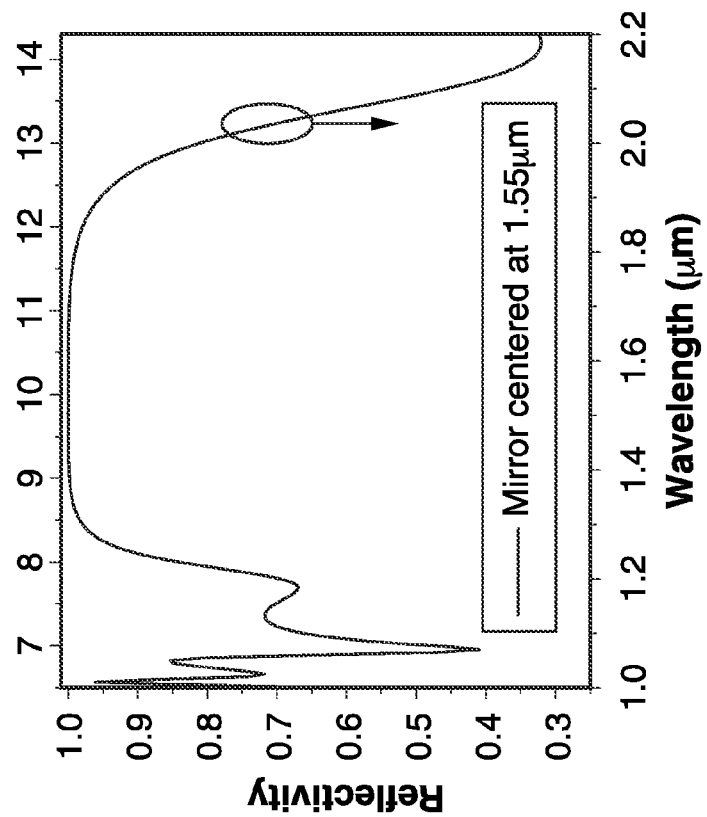
Figure 2D:
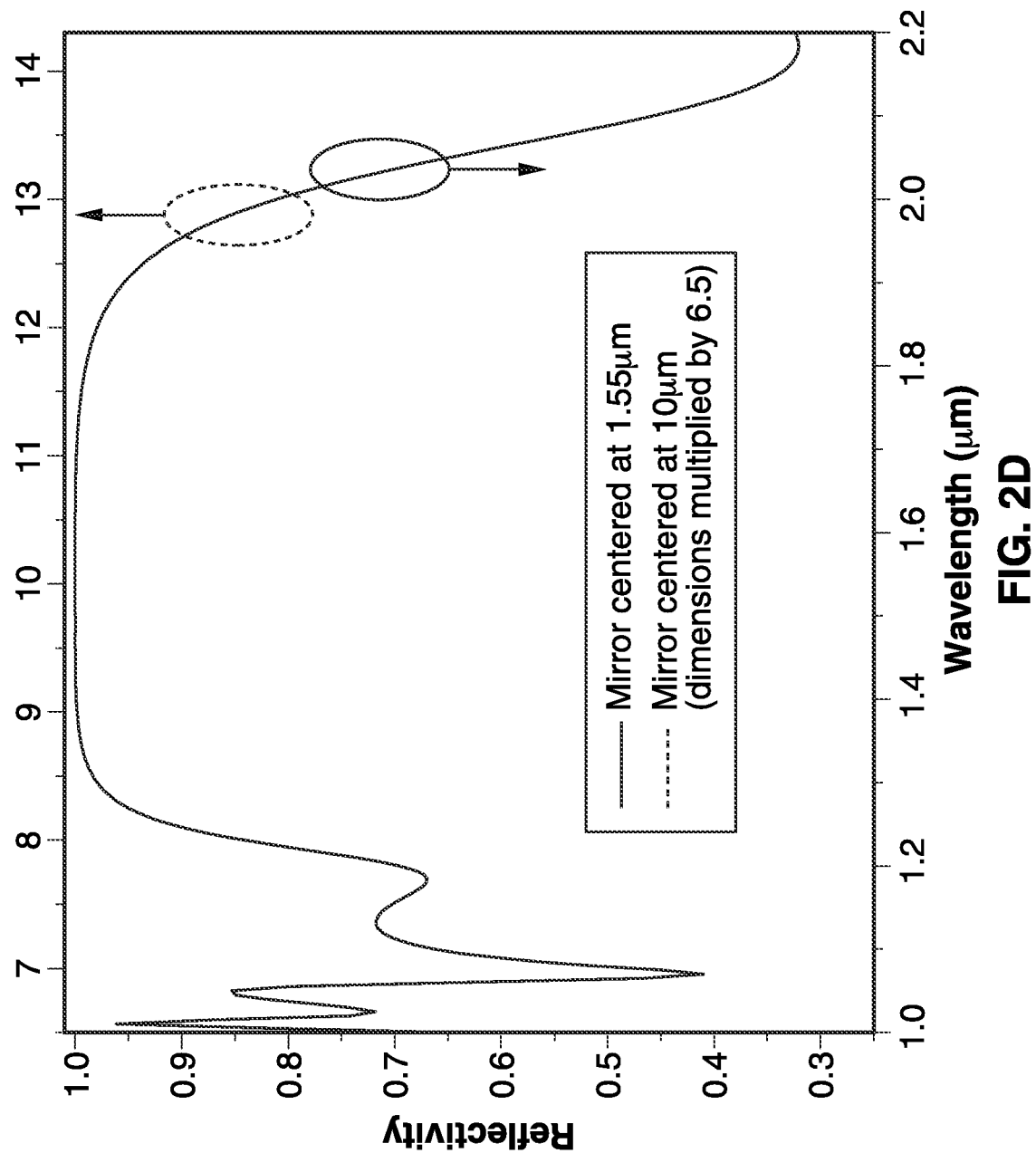

It should be noted that the broadband reflectivity does not result from a resonance, as the period of the grating is sub-wavelength, but not half-wavelength. FIG. 2B illustrates that portion of the reflected power curve associated with a mirror centered at 1.55 μm. Furthermore, the reflectivity spectrum can be scaled with wavelength, as shown in FIG. 2C, by multiplying the geometrical dimensions by a constant, in this case 6.5, while keeping the other parameters the same, wherein the reflection band shifts to the 8.6-11.7 μm wavelength range with all features and values being identical. FIG. 2D illustrates the regions of the curve associated with both 1.55 μm and 10 μm. It should be appreciated, therefore, that any arbitrary wavelength regime can be fabricated from the present teachings. It should also be noted that the same constant has also multiplied the horizontal scale in order to make the comparison easier. Any periodic structure should be wavelength scalable, and herein is provided wavelength scaling that can be manufactured in response to changing the layer dimensions.

Figure 3A:
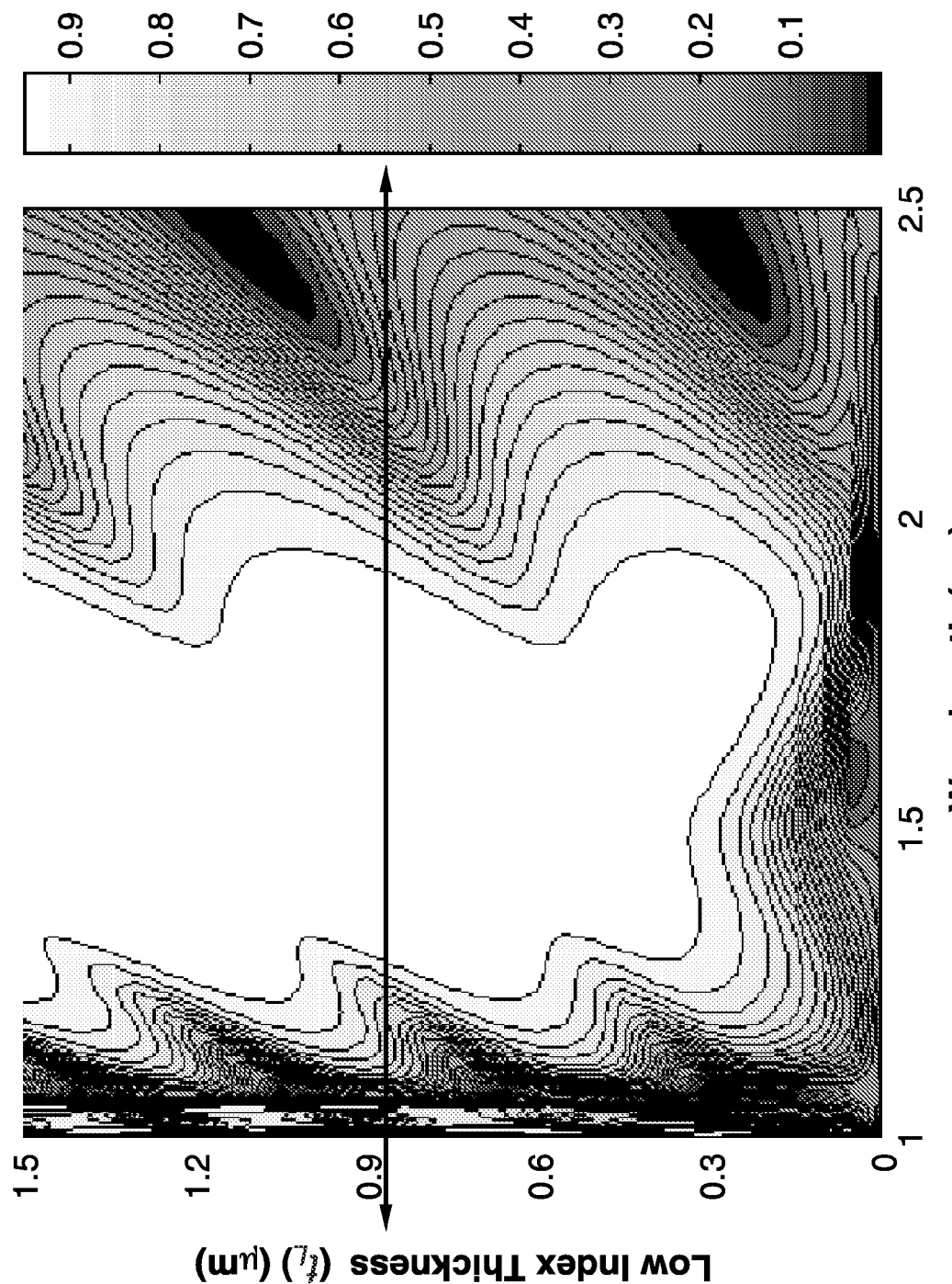
FIG. 3A is a contour map showing reflectivity as a function of wavelength and layer thickness ($t_L$) of the low index material according to an aspect of the present invention.
Figure 3B:
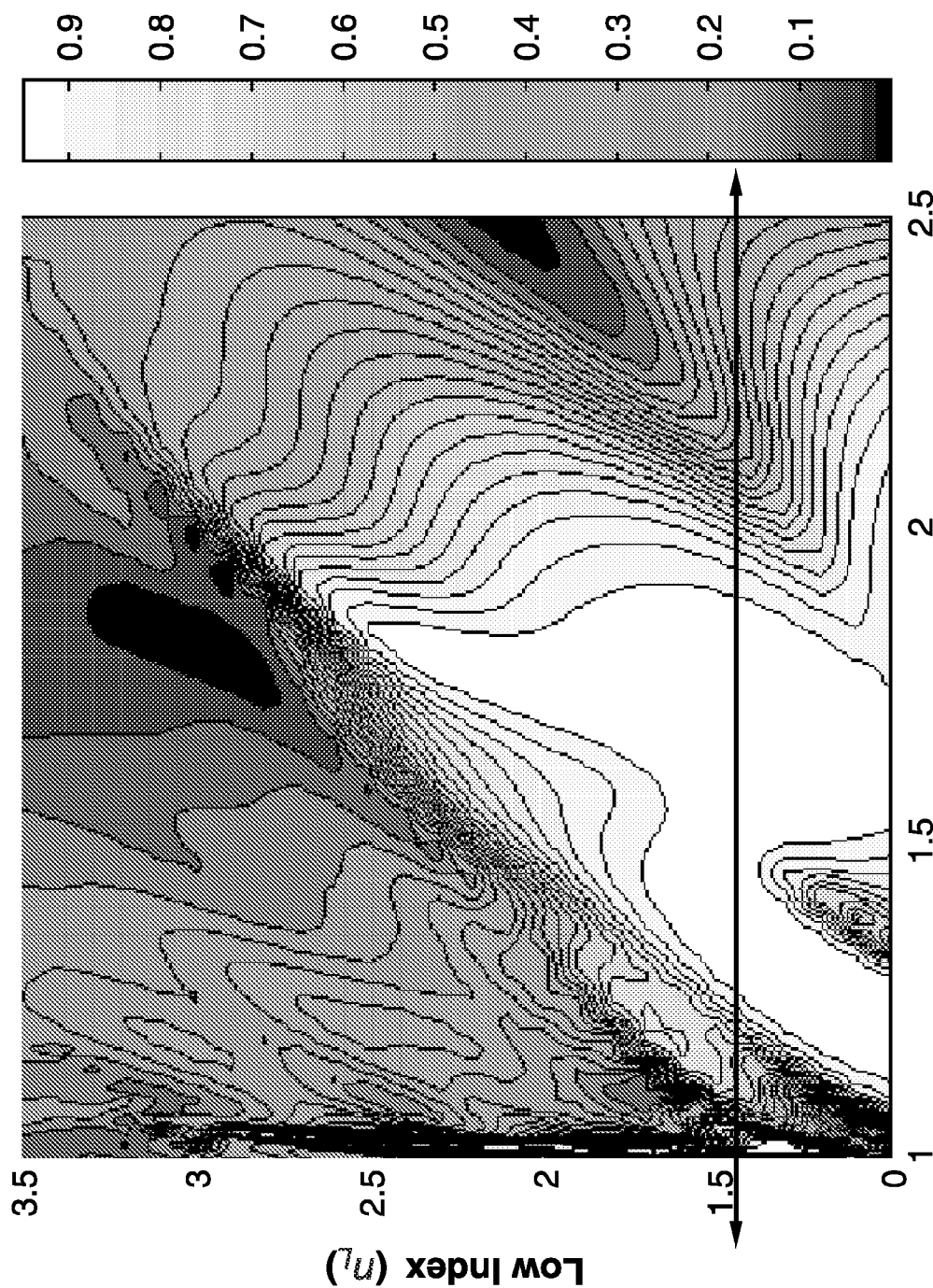
FIG. 3B is a contour map showing reflectivity as a function of wavelength and refractive index of the low-index material ($n_L$) according to an aspect of the present invention.

FIG. 3A and FIG. 3B, are contour plots of reflectivity as a function of wavelength for various values of $t_L$ and $n_L$. These plots show the effect of the low index layer 14 under the grating. It should be recognized that the presence of low index material layer 14 under the grating 16 is important to obtaining high broadband reflection.

FIG. 3A shows reflectivity as a function of wavelength and $t_L$. FIG. 3B shows reflectivity as a function of wavelength and $n_L$. Keeping all the other parameters the same, there is no reflection band for $t_L$<0.1 μm. Above this thickness, the structure has low sensitivity to the low index layer 14, but this parameter can be used to optimize the reflection band. The mirror also does not exist if $n_L$>2.5. If $Si_3N_4$ (n≈2) were used instead of $SiO_2$ as the low index material under the grating, the result would be a much smaller reflection band, ranging from 1.7-1.8 μm.

The various design parameters play a role on the final reflectivity spectrum of the mirror. It can be seen that any material system with a large difference in index of refraction can be used as a base for this broadband mirror, and the larger this difference, the larger the band. The simulations show results for Poly-Silicon/air/$SiO_2$, however, other material combinations, such as $GaAs/Al_2O_3$, GaN/air or $ZnSe/CaF_2$ would be comparable. Thus, grating 10 has been shown to be a potential candidate for several active and passive devices such as visible and infrared wavelength VCSELs and MEM tunable devices.

Figure 4:
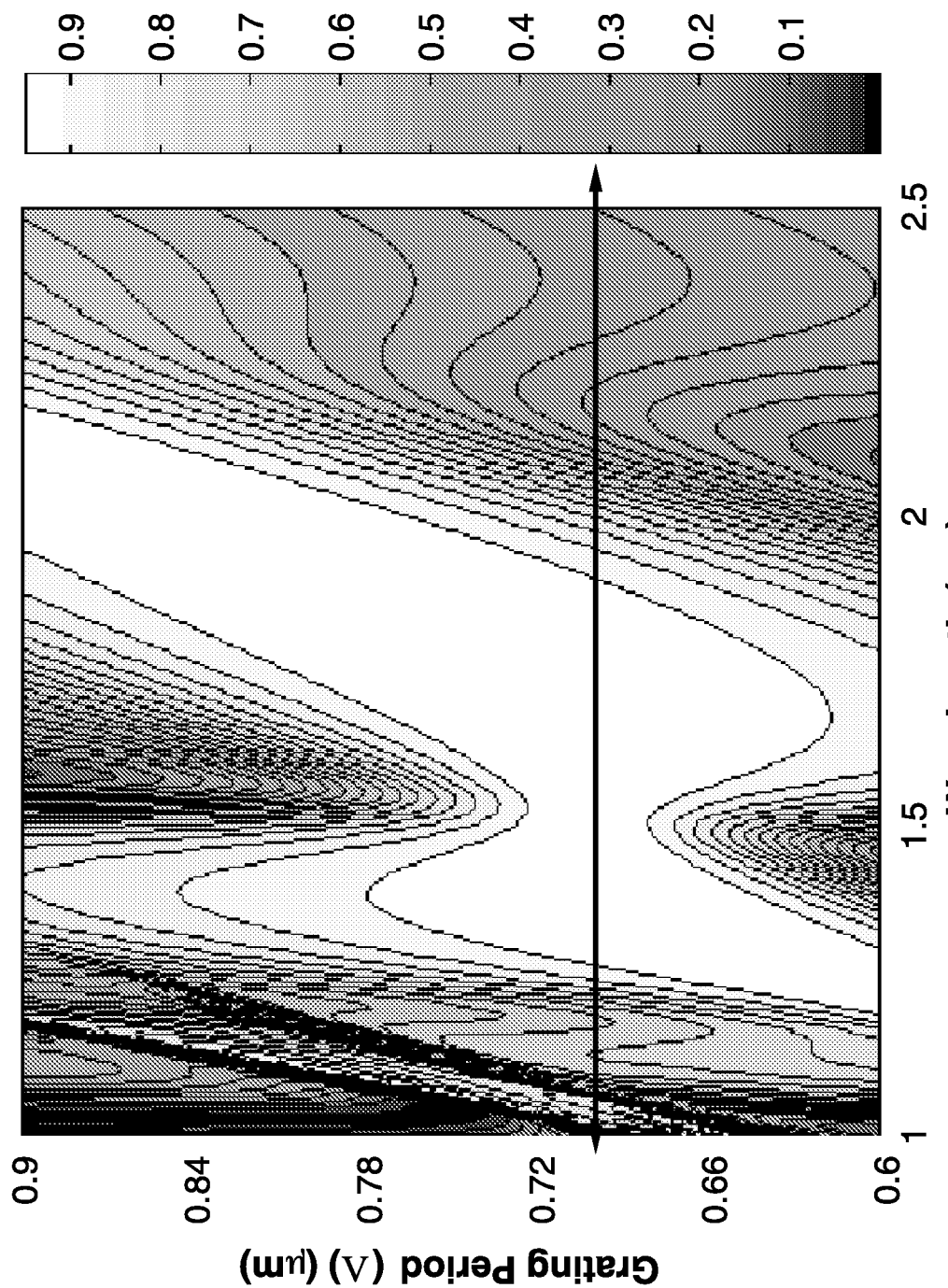
FIG. 4 is a contour map of grating period as a function of wavelength and grating period (Λ) according to an aspect of the present invention.

FIG. 4 illustrates that the grating period 20 determines the location of the center wavelength of the reflection band. The band shifts to longer wavelengths proportionally to the grating period $\Lambda$, and for $\Lambda$=0.07 μm the band is the broadest. The period can be controlled very accurately by lithographic methods and thus, the reflection band can be precisely fabricated.

Grating thickness and duty cycle determine the intensity of modulation, or grating strength. However, this strength cannot increase indefinitely and there is an optimum point where the grating effect is strongest with respect to reflectivity.

Figure 5:
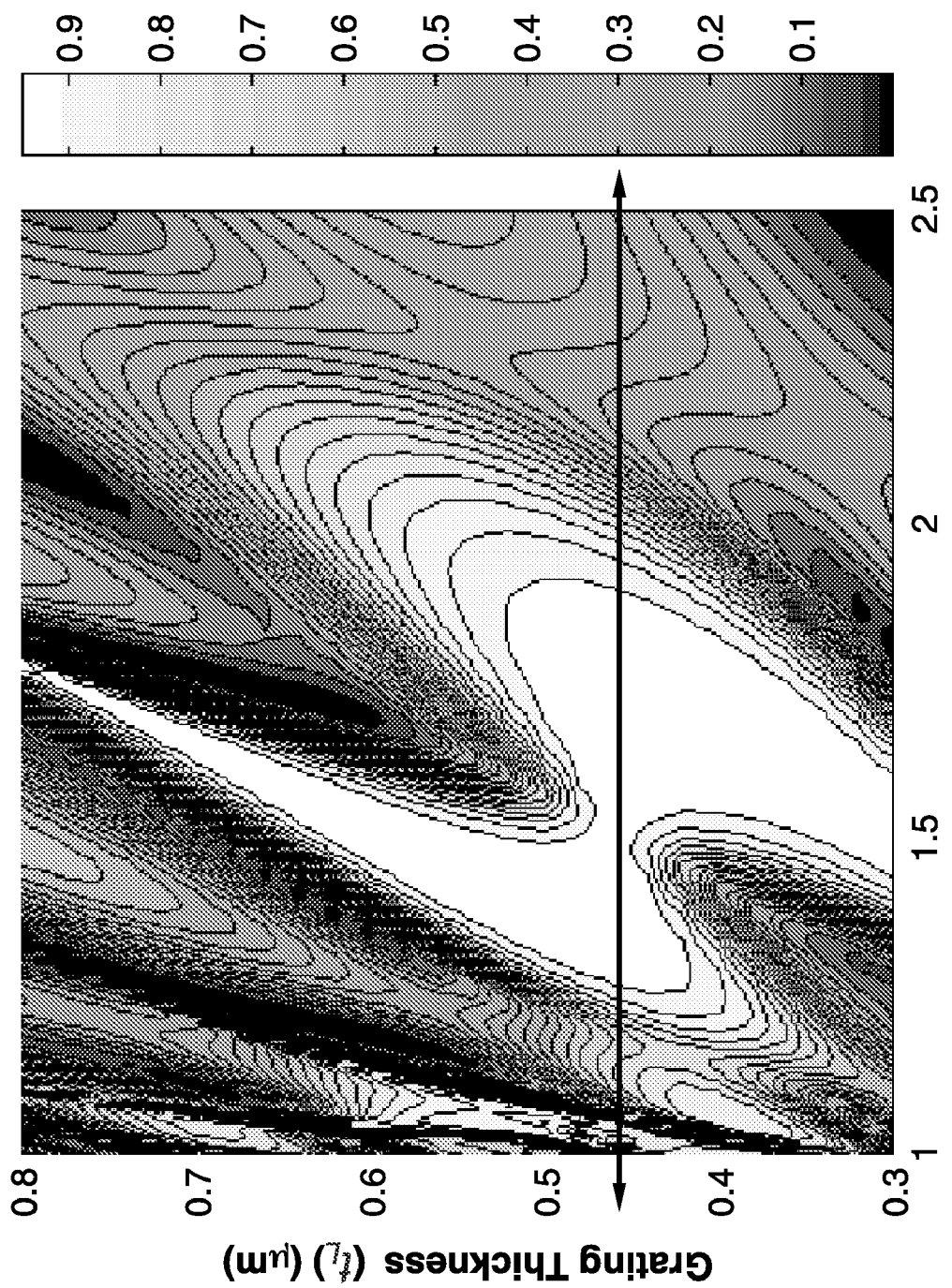
FIG. 5 is a contour map of reflectivity as a function of wavelength and grating thickness ($t_g$), according to an aspect of the present invention.

FIG. 5 shows reflectivity as a function of wavelength and $t_g$. For a very thin grating, the mirror is sharp and the optimized bandwidth occurs for $t_g$=0.46 μm. Above this value, the mirror gets sharp again. As this parameter can be precisely controlled by epitaxial growth or plasma deposition techniques, the optimized design can be easily fabricated.

Figure 6:
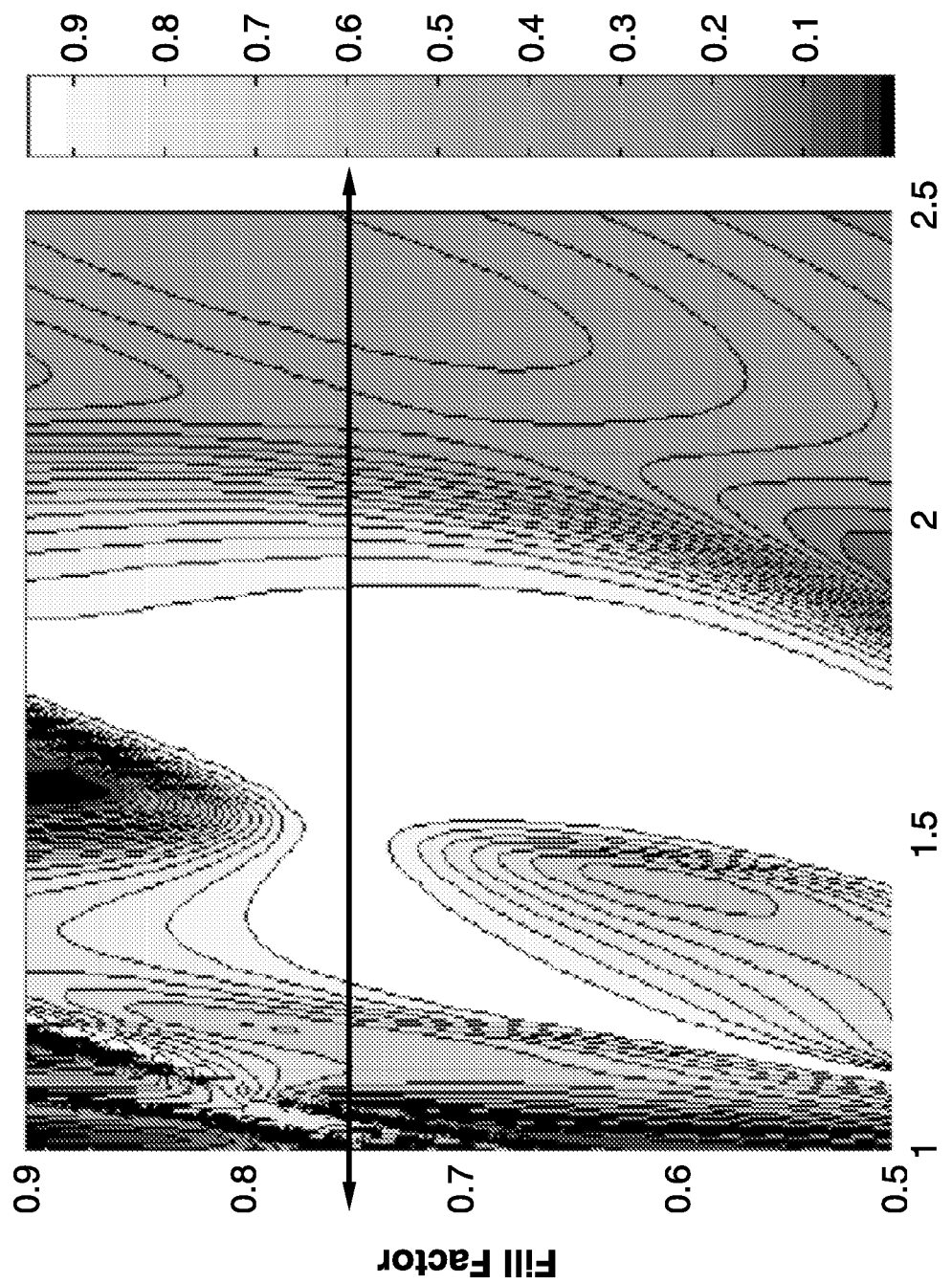
FIG. 6 is a contour map of reflectivity as a function of wavelength and fill factor according to an aspect of the present invention.

FIG. 6 shows reflectivity as a function of wavelength and duty cycle. It can be seen that there are two reflection peaks for a duty cycle of 0.5, one at 1.1 μm and the other at 1.6 μm. As the duty cycle increases, the two peaks merge to form one broad and flat reflection band. This parameter is one of the most important considerations in fabrication as small variations in lithography can change the final value. It may slightly affect the flatness of the band (if the duty cycle gets smaller, the two peaks tend to separate) or its coverage (if duty cycle gets larger, mirror bandwidth decreases).

In the embodiment of FIG. 1 where a linear grating is used, the reflection is polarization dependent. This can be advantageous to control the polarization on a VCSEL, e.g., if the grating design is used for the mirrors. If a 2D symmetrical grating were used in the alternative, reflectivity would be polarization independent. The grating sensitivity to all these parameters can be optimized iteratively. If the application has a less stringent requirement on reflectivity, i.e., <99%, most of the parameters have a large tolerance range, for example allowing up to about 10% variation.

As can be seen, therefore, the present invention comprises a sub-wavelength grating that under normal incident light has very broad reflection spectrum (R>99% and $\Delta\lambda/\lambda$>30%). The mirror can be easily scaled by simply multiplying the dimensions by a constant. This design has potential applications on numerous micro-electro-mechanical tunable devices, VCSELs and reconfigurable focal plane arrays. The design is insensitive to lateral position on cascaded structures and can be easily fabricated monolithically with optoelectronic devices.

EXAMPLE 2

In order to demonstrate the functionality of the design, several single wavelength grating structures according to FIG. 1 were fabricated. The 1D grating structures were formed with stripes of high index material disposed on two low index layers. The high index material was poly-Si ($n_h$)= 3.48, and the low index material within the grating was air (n=1). The low index material under the grating was $SiO_2$ with ($n_L$)=1.47 and a thickness ($t_L$)=0.58 μm and ($t_g$)=0.4 μm. The grating period was varied from 0.7 μm to 0.9 μm and the grating duty cycle was varied 40-80%. The duty cycle is defined as the ratio of the width of the high index material to the total period length. Fabrication was conducted on a silicon wafer and e-beam lithography on PMMA was used for lift off of metal as to mask the top oxide layer, which was etched by RIE. The grating is polarization sensitive and light polarized along the grating lines will not see the band gap. However, if the grating has a two-dimensional (2D) symmetry it will be polarization insensitive.

The measurement set up included a tungsten halogen light source, polarizer, focusing lens and optical spectrum analyzer (OSA). The output light source was coupled to a fiber bundle on one end and the other end coupled to the polarizer, focusing lens and the grating. Reflected light from the grating is collected by the bundle and coupled to the OSA. The trace was normalized by the reflection of a silver coated mirror rated 98.5% reflectivity from 1.1 μm to 20 μm.

Contour plots of reflectivity as a function of wavelength and duty cycle were generated and evaluated. The broadband effect is achieved for a duty cycle of 68% plus or minus 2%. Very broad bandwidth, 1.12-1.62 μm, with greater than 98.5% reflectivity was achieved with a duty cycle of 66%. This measurement is currently limited by the OSA spectra.

The agreement between the simulation and experimental results was excellent. Small variations on parameters such as the index of refraction or thickness or fill factor may slightly alter the performance.

It can be seen that the sub-wavelength grating is scalable with wavelength by simply multiplying the period and grating thickness with the same constant. Hence, using the same materials, the mirror reflection can be simply designed by lithography.

EXAMPLE 3

A simple one-dimensional (1D) grating was simulated to illustrate the scalability of the single wavelength grating structures and the dependence of reflectivity spectrum on various parameters. A very broadband mirror with reflectivity larger than 99%, is obtained over the range of 1.4 μm to 1.7 μm ($\Delta\lambda/\lambda$>19%). The simulation calculations were performed based on Rigorous Coupled Wave Analysis (RCWA) and confirmed by time-domain electromagnetic propagation using TEMPEST®. The high index material was poly-Si ($n_h$)=3.48, and the low index material within the grating was air (n=1). The low index material under the grating was $SiO_2$ with ($n_L$)=1.47 and a thickness ($t_L$)=0.5 μm and ($t_g$)=0.46 μm. The fill factor was 0.75 and the grating period was 0.7 μm. The index of refraction was considered constant along the coverage range.

It can be seen that the period of the grating in the simulation is sub-wavelength (but not half wavelength) and a scalable constant. Accordingly, the structure is scalable by multiplying the period and the grating thickness by the same constant.

The dependence of the reflectivity spectrum on various parameters was also evaluated. It can be seen the importance of a low index layer underneath the grating material since there is no reflection band observed below approximately 0.3 μm. Above 0.3 μm, there is no strong influence of the thickness of the low index layer seen. The results also showed that the reflection band occurs only when ($n_L$) is substantially smaller than ($n_h$). Therefore, if the $SiO_2$ layer with ($n_L$)=1.47 is replaced with $Si_3N_4$ with ($n_L$)=2, no broadband reflection would occur. Additionally, this configuration showed that for a very thin grating, the mirror is sharp and the optimized bandwidth occurs for ($t_g$)=0.46 μm. The results of fill factor verses wavelength showed reflection peaks, one centered at a wavelength of 1.1 μm and the other at 1.6 μm for a fill factor of 0.5. As the fill factor increases, these two peaks merge to form one broad and flat reflection band.

Accordingly, a sub-wavelength grating with very broad bandwidth and high reflectivity is provided. Different center wavelength mirrors can be obtained by simple scaling of the grating dimensions. This unique property will permit the integration with silicon and group III-V based devices such as optical sensors, reconfigurable focal plane arrays and tunable arrays.

EXAMPLE 4

A single layer sub-wavelength grating was fabricated to demonstrate a mirror with a very broad (>500 nm) reflection spectrum from 1.12-1.62 μm (Δλ/λ>35%) with very high reflectivity (R>98.5%). Initially, the proposed structure was simulated. Design parameters for the structure include the index of refraction of the materials involved, the thickness of the low index layer under the grating ($t_L$), the grating period (Λ), grating thickness ($t_g$) and the duty cycle. By recursive analysis, all grating parameters were optimized to maximize both reflectivity and spectral coverage. Based on the measured dimensions of the fabricated sub-wavelength grating, the optimized parameters for the simulation were configured with a high index material of Poly-Si ($n_h$)=3.48, and a low index material within the grating of air (n=1). The low index material under the grating was SiO$_2$ with ($n_L$)=1.47 with the thickness ($t_L$)=0.58 μm and the thickness ($t_g$)=0.46 μm. The grating period (Λ) was established as 0.7 μm and the duty cycle was 68% plus or minus 2%.

The grating in this embodiment was fabricated on a bare silicon wafer using conventional techniques. A silicon dioxide SiO$_2$ layer was grown at 1100° C. Polysilicon was then deposited on top of the oxide layer at 600° C. and a second oxide layer was grown by chemical vapor deposition (PECVD) on top of the polysilicon to serve as a mask for etching the grating. E-beam lithography on PMMA was used for lift off metal (200 Å Cr/80 Å Au) that served as a mask to pattern the top PECVD oxide, which was then etched by RIE. The metal mask was removed and lastly the polysilicon was etched by RIE to form the rectangular grating profile.

The optical measurement setup included a tungsten halogen light source, bifurcated fiber bundle, Glan-Thompson polarizer, focusing lens (NA=0.1) and an optical spectrum analyzer. The trace was normalized using a silver coated mirror in order to eliminate the influence of the blackbody spectrum from both optics and source.

Reflectivity as a function of wavelength for various numbers of duty cycles was recorded. A very broad bandwidth (1.12-1.62 μm) with high reflectivity of R>98.5% was seen with a duty cycle of 66% for linearly polarized light directed perpendicularly to the grating lines. The simulation and experimental results were closely matched. However, the measurements are limited by the sensitivity of the optical spectrum analyzer and low power density of the light source. Small variations in the index of refraction, grating uniformity, roughness of the polysilicon layer and duty cycle variations may slightly alter performance. Improvements in construction techniques should lead to increased performance.

Analysis of the results indicates that the spectral position of the reflection band can be precisely located as it is determined by the grating period (Λ), which can be controlled very accurately by lithographic methods during fabrication. The duty cycle parameter value is also influenced by small variations in etching or surface roughness. Grating and oxide thickness and other parameters can be optimized to provide consistent performance.

EXAMPLE 5

Single layer wavelength grating reflectors can be used in a number of areas. One use is with MEMS-based optical filters. A scanning Fabry-Perot (FP) etalon with an integrated MEMS drive is at the core of these filters. A conventional etalon includes two mirrors separated by an air gap. The top mirror is supported by a mechanical structure and is directed toward the bottom mirror when a voltage is applied across the top and bottom mirrors. When a voltage is applied and the top mirror moves, the air gap is reduced and the transmission wavelength shifts to the shorter side (i.e., a blue shift). Accordingly, when the etalon gap size is varied, the transmission wavelength varies as well. However, one of the limiting factors of tuning range is the range of physical displacement of the top mirror. The larger the physical displacement of the mirror the greater the tuning range.

Figure 7:
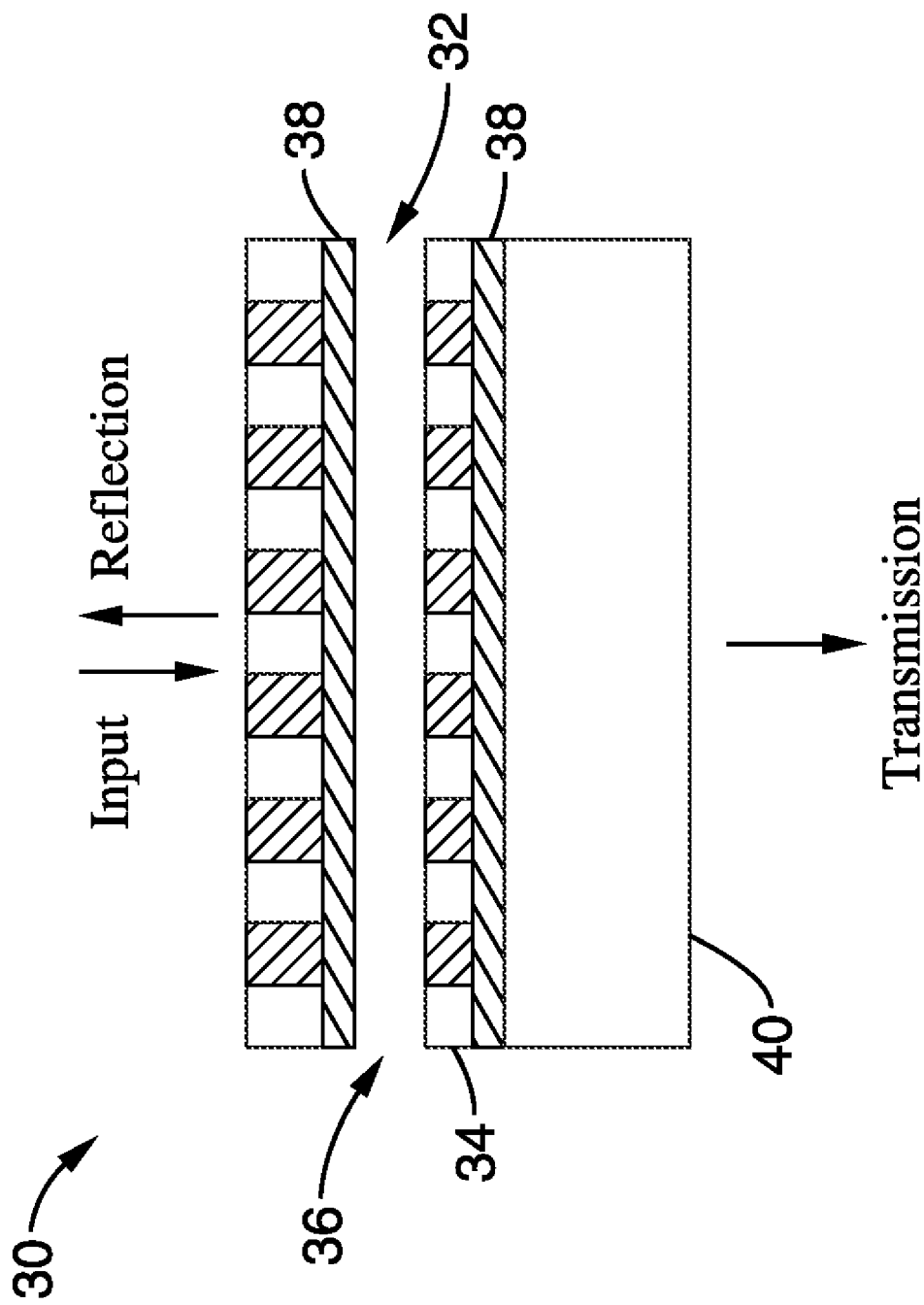
FIG. 7 is a schematic cross-section of a tunable etalon filter consisting of two cascaded sub-wavelength broadband grating reflectors according to an aspect of the present invention.

FIG. 7 illustrates another embodiment of a tunable etalon 30 shown having two single layer sub-wavelength gratings. The structure 30 has a top mirror 32, a bottom mirror 34 and a tunable air gap 36. It has been shown that continuous tuning of transmission wavelengths from 11 μm to 8 μm can be achieved with an air gap 36 size range of 6 to 3 μm.

Figure 9:
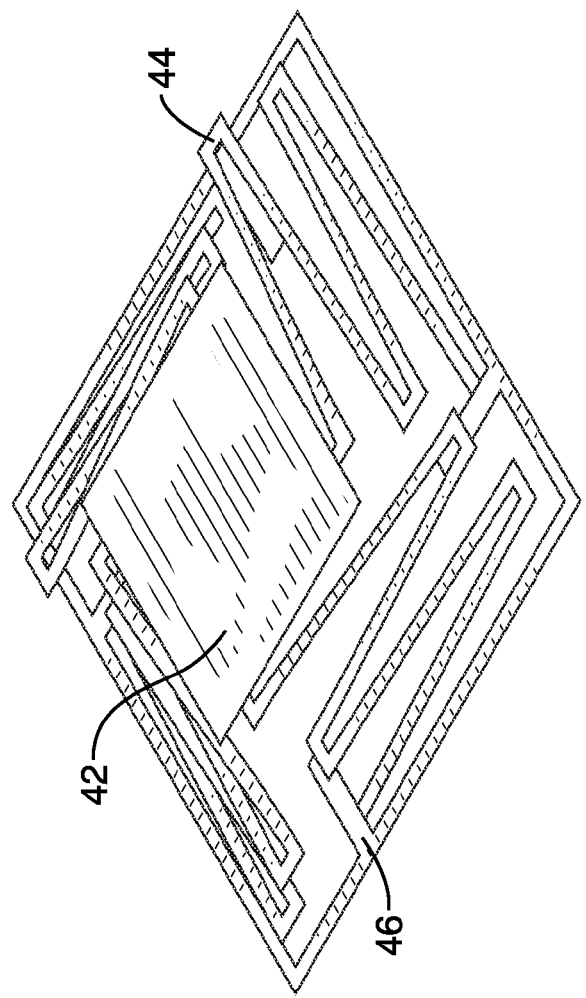
FIG. 9 is a top perspective view of the embodiment of FIG. 8 with the spring contacts vertically displaced according to an aspect of the present invention.
Figure 8:
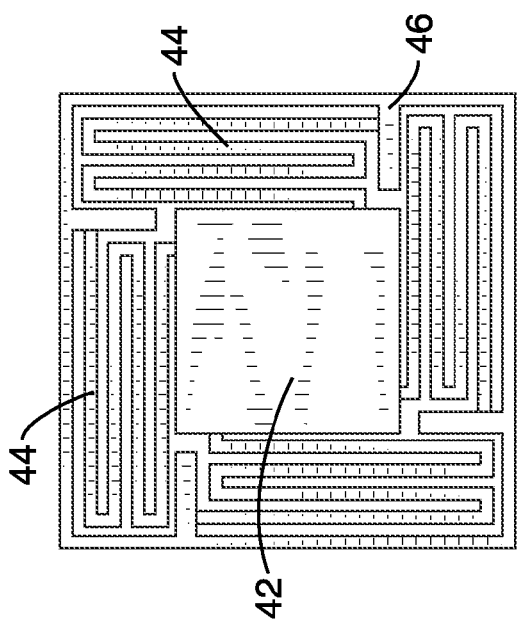
FIG. 8 is a top view of one embodiment of a single pixel of a tunable filter with folded springs according to an aspect of the present invention.

FIG. 8 and FIG. 9 illustrate another embodiment having a single pixel 32 of a tunable filter with folded spring contacts 42 that are anchored in a base 44. It can be seen that these units can be set in an array of addressable filters amenable to matrix addressing techniques.

The structure of the sub-wavelength grated reflectors, for purposes of simulations, was a simple 1D grating with a grating period (Λ) of 4.5 μm, a grating thickness ($t_g$) of 4 μm and a duty cycle at 50%. The indices for the high and low index medium are 3.6 and 1 respectively.

Figure 10:
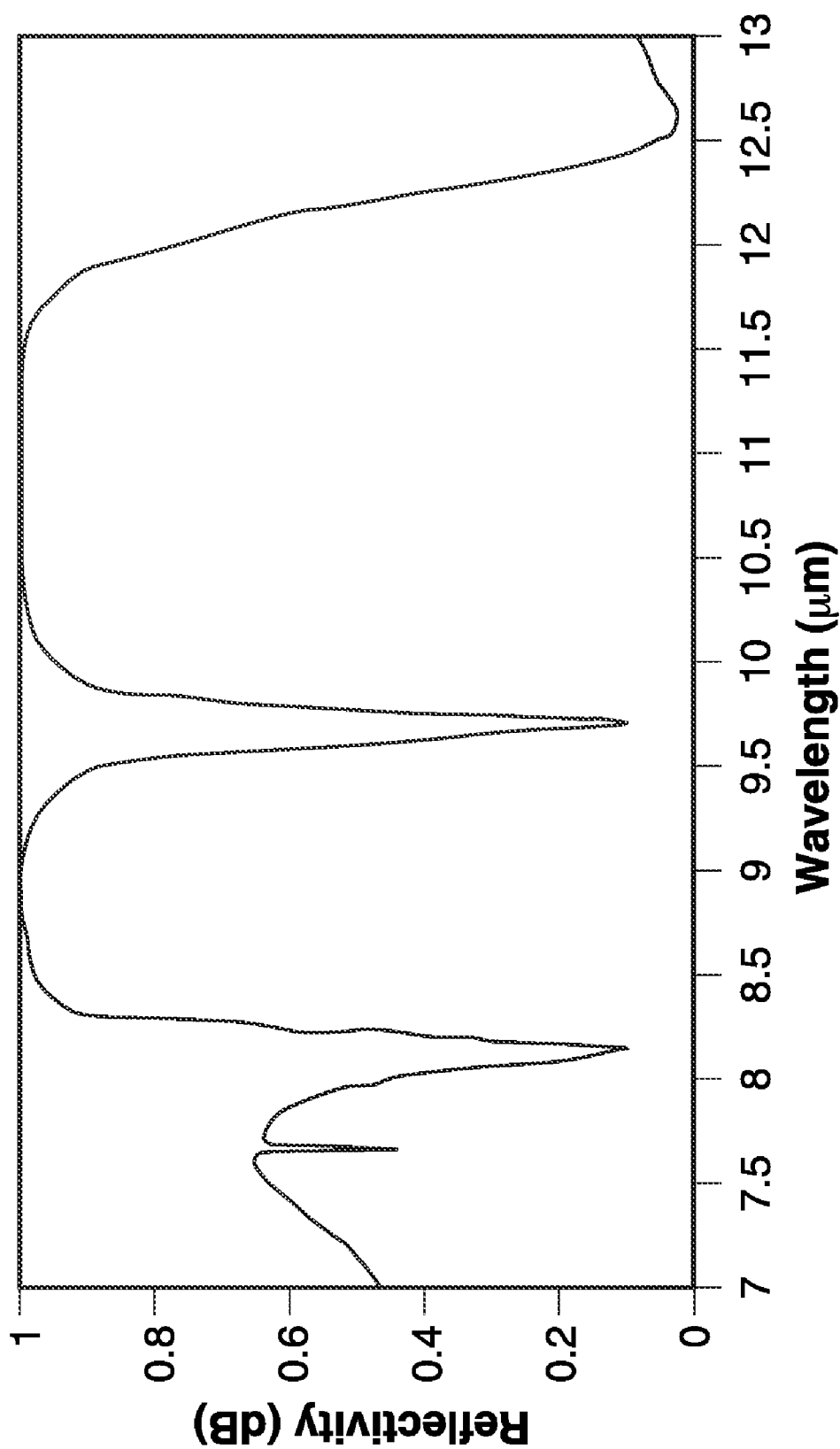
FIG. 10 is a graph of reflection spectra as a function of wavelength for the structure illustrated in FIG. 7 according to an aspect of the present invention.

FIG. 10 illustrates a single narrow passband being produced as expected from an FP etalon. The line width of the passband is determined by the reflectivity of the top and bottom grating mirrors, which can be varied by adjusting the grating period, duty cycle, layer thickness and index contrast. In addition, the mirror band is defined by short and long wavelengths where the reflectivities are zero or go to a local minimum.

The folded spring structure 44 in the embodiment shown in FIG. 8 and FIG. 9 is configured to overcome the small fill factor of existing structures while maintaining a reasonably low operating voltage. The tradeoff in existing etalon designs is the voltage required to move the mirror and the length of the cantilever or membrane. To restrict the tuning voltage to less than approximately 100 volts, the lever arm lengths are typically several hundred microns in length in existing designs. In the embodiment shown in FIG. 8 and FIG. 9, the spring constant of folded spring 44 is nearly equivalent to a membrane of the same dimension having its full length extended. The voltage to move the mirror is nearly the same as if the folded spring 44 were fully extended outwards. Accordingly, the fill factor can be greatly improved and pixel size reduced without the compromise of a very high voltage.

It can be seen that varying the length, width and number of folds of the folded arm spring 44 can optimize the tuning voltage. The maximum drive voltage, defined as the voltage required to move the top mirror to reach maximum tuning as a function of filter head size, will support a 50 μm pixel size. With a single pair folded spring design, the filter head can be as large as 28 μm with a 25-volt maximum voltage. The design of the etalon is flexible and can be extended to a wide range of wavelengths by simply scaling the grating dimensions and spring dimensions.

EXAMPLE 6

A tunable optical filter consisting of two cascaded sub-wavelength grating mirrors with a variable air gap, as illustrated in FIG. 7, was analyzed. The parameters of top 32 and bottom 34 gratings are both optimized for R>99% for 1.3-1.8 μm, in order to obtain the narrow transmission linewidth through the Fabry-Perot resonant cavity. The transmission spectra for different air gap distances were calculated using Rigorous Coupled Wave Analysis.

If the top suspending SWG can be actuated by a micromechanical method, a very broad wavelength tuning range of 600 nm can be achieved. Since the thickness of the SWG structure is smaller compared to conventional distributed Bragg reflectors, a lower voltage is required to actuate the device.

In a second analysis, it was possible to achieve broad and continuous (~200 nm) wavelength tuning by varying the air gap 36 between the top 32 and bottom 34 SWG reflectors. Also, The simulation showed very narrow transmission linewidth (<1 Angstrom) across the entire 200 nm tuning range due to the high reflectivity of the two SWG reflectors. Furthermore, the SWG is insensitive to lateral position on the cascaded structure and can be readily fabricated monolithically with other optoelectronic devices.

In addition, although the analysis was based on uniform gratings, nonuniform (such as chirped or sampled) gratings may also be utilized, thus creating the possibility of engineering the passband lineshape such that it is independent of tuning. This is impossible to do with other tunable filter techniques.

EXAMPLE 7

A potentially important application of the sub-wavelength grating (SWG) is its incorporation in active optoelectronic devices (e.g., lasers and detectors) in order to provide the optical feedback in the surface normal direction. The sub-wavelength gratings provide a number of benefits over semiconductor-based distributed Bragg reflectors (DBR) when implemented on a first or second surface within a vertical cavity surface emitting laser (VCSEL).

A conventional VCSEL utilizes two distributed Bragg reflectors (DBRs) with an active region residing in the center of the cavity layer. The active region may consist of any desired quantum structures in either single or multiple layers. Depending on application, the quantum structures may be additionally or alternatively incorporated within the high refractive index material of the SWG. The quantum structures, for example, may comprise quantum wells, quantum dots, quantum wires, or any combination thereof. The DBRs can comprise either doped or undoped material. Current can be injected into the active region utilizing any desired structure, such as via a current guiding structure either provided by an oxide aperture or proton-implanted surroundings. The laser emission wavelength is determined by the Fabry-Perot resonance wavelength of the cavity and DBRs, as well as the active region gain bandwidth. The limited bandwidth of semiconductor based DBRs restrict the range of achievable emission wavelengths. The use of a highly reflective and broader bandwidth mirror, such as the SWG described here, extends the range of bandwidths and provides additional benefits. Given the quantum dot gain bandwidth is as wide as 300 nm, it is desirable to use one mirror design to cover the entire spectra.

FIG. 11 and FIG. 12 illustrate SWG-VCSEL embodiments 50, 60 with one SWG 52 as the top mirror. In FIG. 11 the SWG top mirror 52 is combined with a conventional semiconductor-based DBR 56 as the bottom mirror, and the optical cavity exemplified as an active region 54, for example quantum wells or quantum dots in either single or multiple layers. The details of current injection and current/optical confinement is not shown for either figure. Referring to FIG. 12 embodiment 60 utilizes an air-gap cavity 62 within the SWG-VCSEL structure, and an SWG bottom mirror 64. SWG layers comprise both top and bottom mirrors with an optical cavity layer between the two highly reflective SWG mirrors. To provide a low index material adjacent the bottom SWG, an airgap (or low index material) 62 is disposed between the SWG 64 and optical cavity layer, for example utilizing wafer-bonding or epitaxial re-growth techniques.

FIG. 13 and FIG. 14 illustrate an example embodiment 70 of a wavelength variable VCSEL resonant cavity structure shown in top and side views. The variable VCSEL has a SWG 72 upon protective DBR layers 74, optical cavity 76 and lower DBR layers 78. SWG 72 is formed with a base member 80 from which extends flexible cantilever member 82 attached to a SWG grating 84 with slots 86 which are preferably transverse mounted in relation to the motion of flexible beam 82. An air gap 88 is created between the SWG grating 84 and the surface of the device having protective DBR layers. The strips of high reflectivity material in this grating embodiment are formed from material 84 that is disposed between slots 86. In the embodiment shown the SWG 72 can be formed from a layer of high reflectivity material forming an upper portion of base 80, flexible member 82 and grating 84, coupled to a lower portion of base member 80 whose thickness determines nominal spacing, or from separate sections forming base 80, flexible member 82 and SWG grating portion 84, or any combination thereof.

It will be appreciated that changing the physical spacing between the mirrors in a VCSEL produces a variation in the Fabry-Perot resonance wavelength and hence a wavelength-tunable VCSEL which is accomplished by the embodiment shown, as well as variations, which for example, may utilize different forms of flex structures and/or MEMS motion control. By supporting a sub-wavelength grating 84 on a micro-electromechanical (MEMS) cantilever beam 82, the air-gap 88 of the freely-suspending SWG can be varied by methods including, but not limited to, electro-static, thermal, or piezo-electric actuation. The MEMS tunable VCSEL according to this aspect of the invention has the potential of increasing resonant frequency and tuning range while capable of actuation at reduced power levels.

Vertical external cavity surface emitting lasers (VECSEL) are semiconductor lasers with a non-monolithic laser cavity, wherein the emitted light leaves the device in a direction perpendicular to the chip surface. The semiconductor device contains only a single semiconductor distributed Bragg mirror and the gain region with typically several quantum wells and the total thickness of only a few micrometers. The cavity is completed with an external mirror, typically at a distance on the order of a few millimeters or centimeters. For such configuration of VECSEL, it is recognized that either or both of the on-chip semiconductor distributed Bragg mirror and the external mirror can be replaced by SWG-based mirror.

The long cavity of the VECSEL allows for mode-locked operation with pulse repetition rates of typically a few GHz. For passive mode locking of optically pumped VECSELs, a laser diode can be used as the pump source and a semiconductor saturable absorber mirror (SESAM) utilized in the external cavity for mode locking. It is recognized that the integration of a semiconductor saturable absorber within the high-index segments of SWG can greatly simplify the fabrication process. This embodiment can provide average output power exceeding well over 1 watt, with high quality pulses with typical durations in the picosecond range.

The sub-wavelength grating (SWG) offers many advantages in both VCSEL performance and simplicity of VCSEL fabrication. In view of the large index contrast of the grating, SWG can provide extremely high reflectivity (>99%) with ultra-broad bandwidth ($\Delta\lambda/\lambda$>30%). The result is a bandwidth that is approximately 3-5 times larger than the bandwidth provided for systems incorporating conventional semiconductor-based DBRs. In terms of fabrication simplicity, an SWG structure requires significantly fewer layers of material deposition where the periodic index modulation of the grating is in-plane and can be readily fabricated, for example by utilizing an optical lithography process. In contrast, fabrication of a DBR requires 25-30 pairs of alternative materials with very precisely controlled thickness.

The reflectivity of a sub-wavelength grating is polarization dependent. It should be recognized that only linearly polarized light with an electric field in the direction perpendicular to the grating lines is subject to the high reflectivity of the surface across a broad wavelength range. This intrinsic polarization selectivity of reflectivity can be utilized to control emission polarization of the VCSEL and hence minimize the polarization-dependent noises of the output VCSEL light.

The reflectivity of SWG is determined by parameters (i.e., grating period and duty cycle) that can be determined during fabrication, such as by optical lithography processes. The emission wavelength of the VCSEL can thus be controlled during optical lithography or other fabrication processes. This characteristic of the VCSEL allows advantageously matching the emission wavelength of the VCSEL with a wavelength division multiplexing (WDM) grid defined by ITU (International Telecommunications Union) Furthermore, it would be possible to readily fabricate a VCSEL array with the emission of each device producing a different emission ITU wavelength. It should be noted that the modification required to provide a step change in frequency per device only requires changes in one or two steps in the fabrication process and does not require changes to materials and deposition involving 30-40 separate layers as would be the case in fabricating conventional reflectors.

Reflectivity of the mirrors is dependent on the spot area of emitted light because the pattern area of a SWG is finite (e.g., 10 µm×10 µm area of VCSEL top surface). Taking advantage of these properties the transverse emission modes of the VCSEL can be controlled wherein the reflectivity of higher-order transverse modes would be less than the reflectivity of the fundamental mode.

EXAMPLE 8

Figure 16:
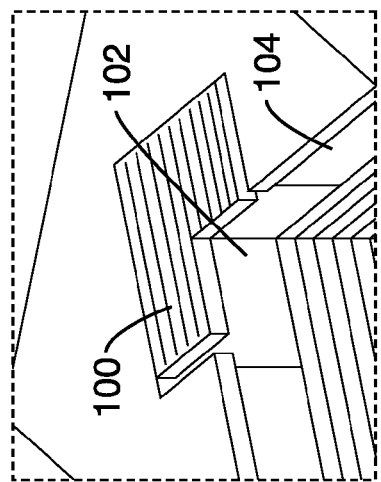
FIG. 16 is a detailed view of the MEMs actuated wavelength tunable SWG top mirror of the wavelength tunable vertical cavity surface emitting laser (VCSEL) of FIG. 15.
Figure 17:
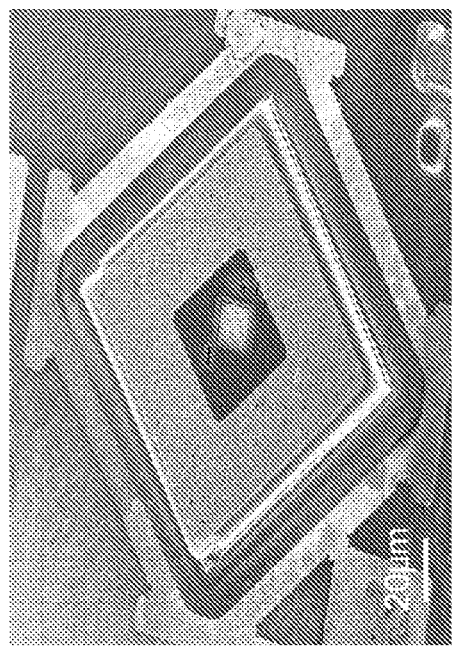
FIG. 17 is an SEM image of the wavelength-tunable VCSEL of FIG. 15.
Figure 15:
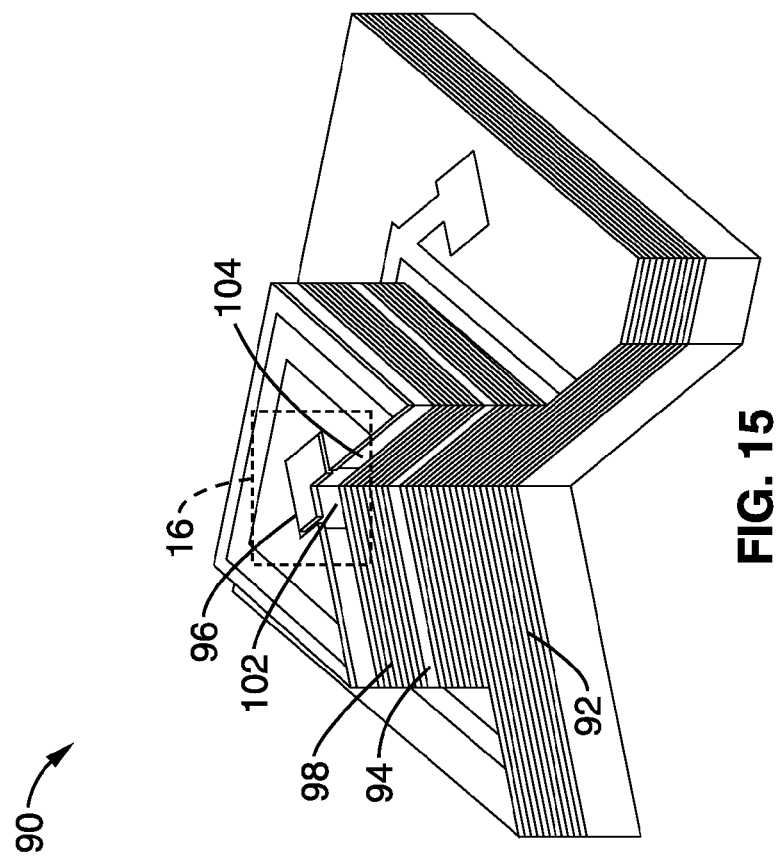
FIG. 15 is a schematic view of a wavelength tunable vertical cavity surface emitting laser (VCSEL) according to an embodiment of the present invention, shown with SWG top mirror.

FIG. 15 through FIG. 17 illustrate another example embodiment 90 of a wavelength variable SWG-VCSEL. In FIG. 15 a schematic of the SWG-VCSEL device is shown, with a detail view of the SWG structure shown in FIG. 16. An SEM image of a fabricated SWG-VCSEL device is shown in FIG. 17. In this embodiment the SWG mirror structure is defined in the center of the VCSEL mesa. By way of example, and not limitation, the SWG-VCSEL device shown is an 850 nm oxide-confined VCSEL with monolithic integration of SWG as the top mirror adapted for movement by a MEMS device. The device comprises a semiconductor-based n-DBR mirror 92 as a bottom surface, a λ-cavity layer 94 with the active region, and a SWG-based top mirror 96 comprising a fixed p-DBR 98 and a freely suspended SWG 100. The choice of the number of fixed p-DBR layers (e.g., four in this example embodiment) is determined to provide current spreading while protecting the active region during fabrication. In principle, fixed p-DBR 98 is not required as SWG 100 is capable of providing sufficient reflectivity as the top mirror. Electric current injection is conducted through the top contact (via the p-doped SWG layer) and bottom contact (via the n-DBR). An aluminum oxide aperture is formed, such as from the thermal oxidation of an AlGaAs layer, in the p-DBR section 98 immediately above cavity layer 94 to provide efficient current and optical confinement. A section 102 is shown having a low index of refraction, such as comprising air, which may be formed for example in response to removal of a portion of material layer 104.

EXAMPLE 9

Figure 18:
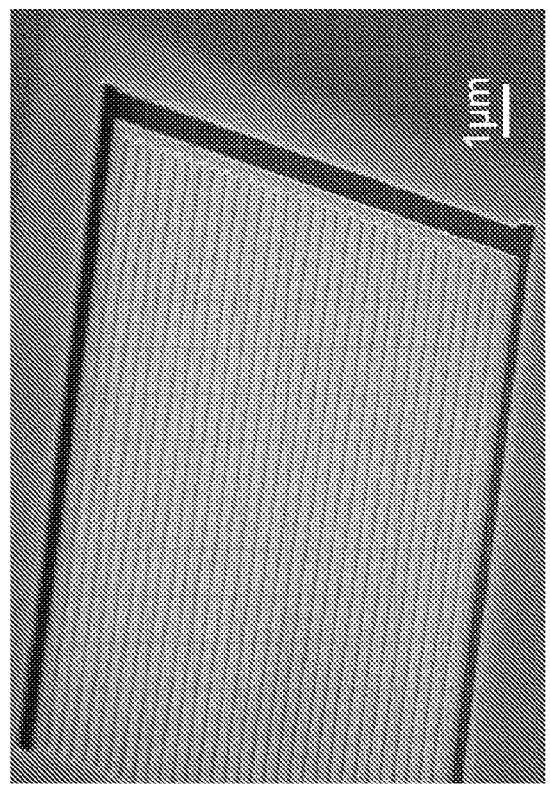
FIG. 18 is an SEM image of the freely suspended SWG of the wavelength-tunable VCSEL of FIG. 17.

FIG. 18 is a close-up image of a different SWG embodiment of a freely suspended SWG structure having a novel C-shape trench surrounding the grating to eliminate buckling of the suspended gratings after the release process, which can be accounted from the residual stress in the material accumulated during material growth. Instead of having a silicon gratings lying on top of low index dielectric (i.e., $SiO_2$) as in previous embodiments, it consists of periodic stripes of $Al_xGa_{1-x}As$ that is freely suspended with air as the low index cladding layers on its top and bottom. The choice of x in $Al_xGa_{1-x}As$ composition is preferably determined in response to fabrication considerations, such as where a large aluminum composition would increase the selectivity of etching between the SWG material and underlying sacrificial layer.

In this example, a portion of the large reflection bandwidth of the SWG has been traded-off to increase the fabrication tolerance while still providing sufficient bandwidth for VCSEL operation. Simulations performed on this embodiment indicate that greater than ±10% variation in terms of fabrication imperfections can be tolerated, such as those affecting the grating parameters: period, duty cycle, and/or thickness. This embodiment provides an additional illustration of the flexibility and scalability of SWG to adapt to various wavelengths and not be limited by material growth. The parameters used in the simulation were: grating period (Λ)=0.38 µm, high index material ($n_g$)=3.21, low index material within, above and below the grating ($n_l$)=1, airgap thickness ($t_L$)=1.05 µm, grating thickness ($t_g$)=0.23 µm and duty cycle (DC)=0.6. Duty cycle is defined as the ratio of the width of the high index material to the period.

Since the SWG design is configured with 1D symmetry, it is polarization sensitive, wherein transverse-magnetic (TM) polarized light with an electric field perpendicular to the grating lines sees higher reflectivity than the transverse-electric (TE) polarized light. The simulation of the VCSEL top mirror for both the TM and TE polarizations was based on calculations based on Rigorous Coupled Wave Analysis method (RCWA). The reflectivity for the TM polarized light is greater than approximately 99.9% for wavelength ranges of 0.80 µm to 0.88 µm, and for TE polarized light it is approximately 95%. Accordingly, the SWG provides a number of benefits as a top mirror for a VCSEL with lithographically controllable polarization. To ensure the contribution of SWG, it is calculated that the reflectivity of the VCSEL top mirror consisting of four pairs of fixed DBR pairs is at most about 70%.

Fabrication

Typically a standard VCSEL fabrication process requires the following steps: two metal deposition steps (for p- and n-contacts), mesa definition etch, and thermal oxidation. For the SWG-VCSEL according to the present invention the grating is defined according to any desired VCSEL processing steps. The choice of sequences allows proper alignment of SWG to the center of VCSEL mesa and control of desired oxide aperture size. The lithography of SWG was defined using electron-beam lithography, such as on polymethyl methacrylate (PMMA) photoresist, which offers the design flexibility of grating period and duty cycle. However, given the current optical lithography capability (pushing toward 65 nm), the SWG can also be easily defined by more cost and time effective methods such as DUV stepper or nano-imprinting. After the lithography step, the SWG patterns are transferred to wafer by reactive ion plasma etching (RIE), to form the rectangular grating profile. Finally, a wet chemical-based selective etch, followed by critical point drying, removes the sacrificial material underneath the SWG layer and forms the freely suspending grating structure.

In the release etch process, selectivity between the SWG and sacrificial material is very important, since insufficient selectivity will result in the reduction of the grating width and thickness. Given the large aspect ratio of the grating length to its thickness or width, special care must be taken in the critical point drying to eliminate the stiction of the grating fingers.

Experimental Results

Figure 19:
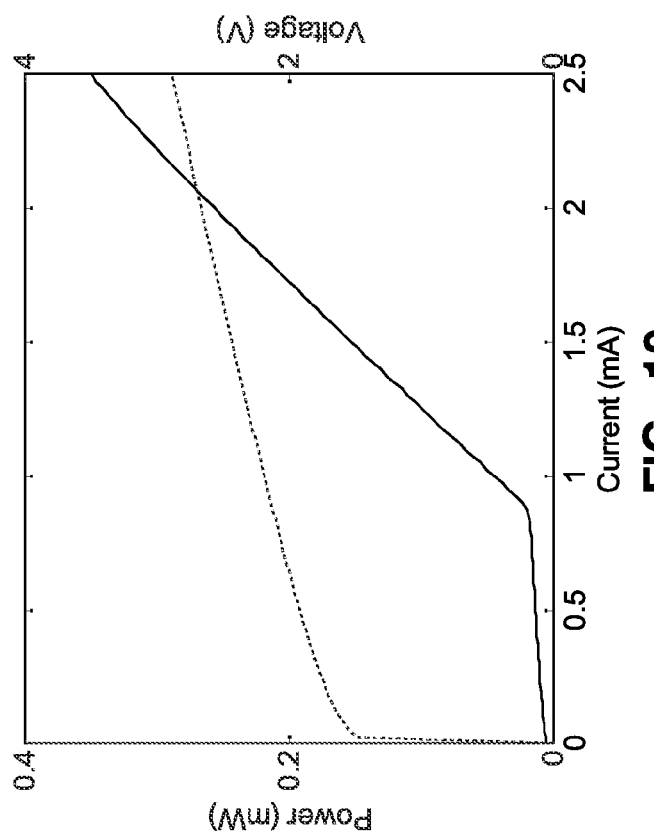
FIG. 19 is a graph of light-intensity-current and current-voltage characteristics of the fabricated SWG-VCSEL of FIG. 17 according to an aspect of the present invention.

FIG. 19 illustrates measured light intensity-current and current-voltage characteristics of a fabricated SWG-VCSEL according to the invention. With the SWG integrated as the top mirror, continuous-wave (CW) operation of SWG-VCSEL was demonstrated for the first time at room temperature. The device exhibits low threshold current of less than approximately 1 mA with output power of approximately 0.4 mW. These results are indicative that reflectivity exceeding 99.5% has been achieved with the SWG. The output power currently is limited by thermal effects, as indicated by thermal roll-off behavior at small bias current. Larger output power, such as exceeding 1 mW is expected with further optimization of the thermal and electrical design.

Figure 20:
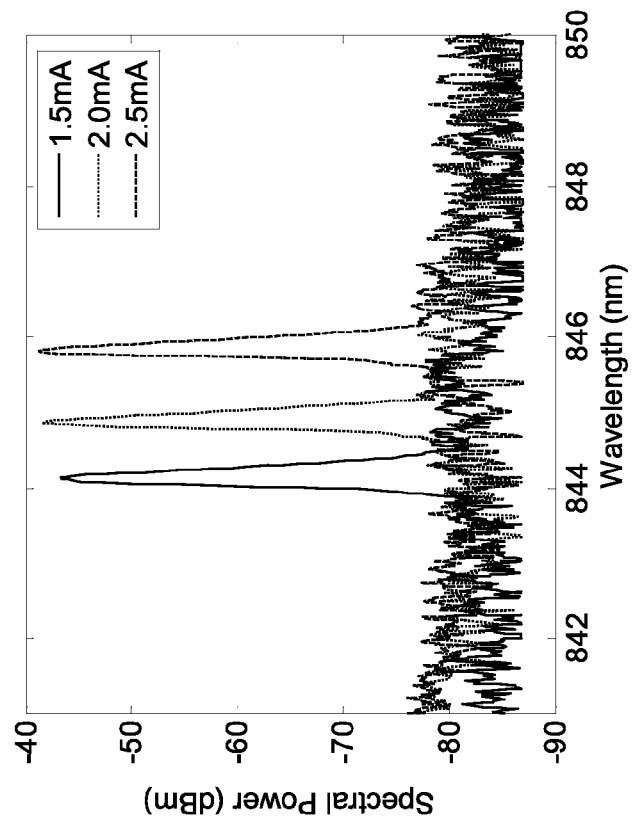
FIG. 20 is a graph of measured optical spectra for a fabricated SWG-VCSEL of FIG. 17.

FIG. 20 illustrates measured emission spectra of the SWG-VCSEL under various injected current levels. With the aluminum oxide optical confinement (aperture size of 4 μm), single mode emission with 40 dB side mode suppression ratio was obtained. However, due to the thermal effects, the SWG-VCSEL exhibits a wavelength dependence on current (~2 nm/mA) which is larger than that of typical VCSEL (~0.4 nm/mA).

Figure 21:
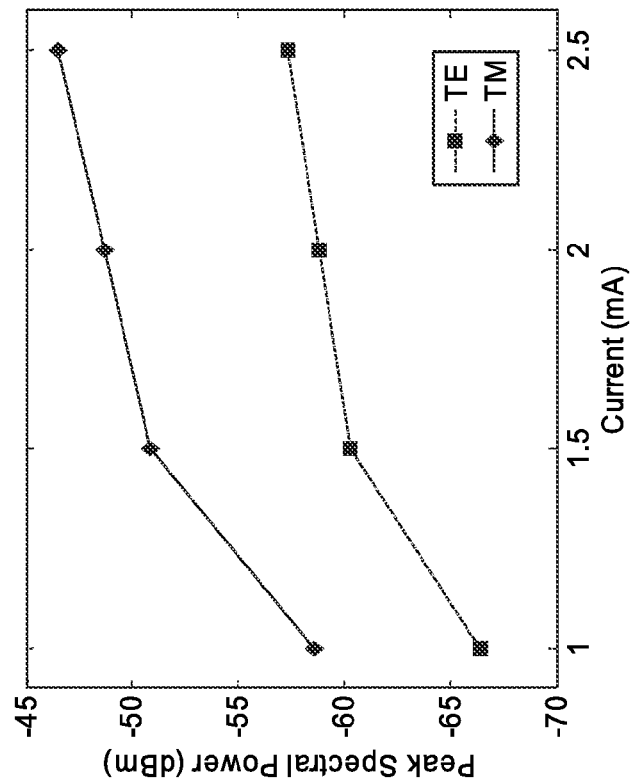
FIG. 21 is a graph of measured peak spectral power for emission of different polarizations for the SWG-VCSEL of FIG. 17.

FIG. 21 illustrates the measured peak spectral power of the SWG-VCSEL for different injected current for both the TM and TE polarization. Since SWG reflectivity is polarization dependent, it is expected that the VCSEL emission would be polarization selective. It is evident that besides providing high reflectivity, utilizing SWG can control emission polarization (lithographically determined), such as with an orthogonal polarization suppression ratio (OSPR) of approximately 15 dB. This intrinsic polarization selectivity nature can be utilized to control the polarization of VCSEL and hence minimize the polarization-dependent noises of the output VCSEL light.

Figure 22:
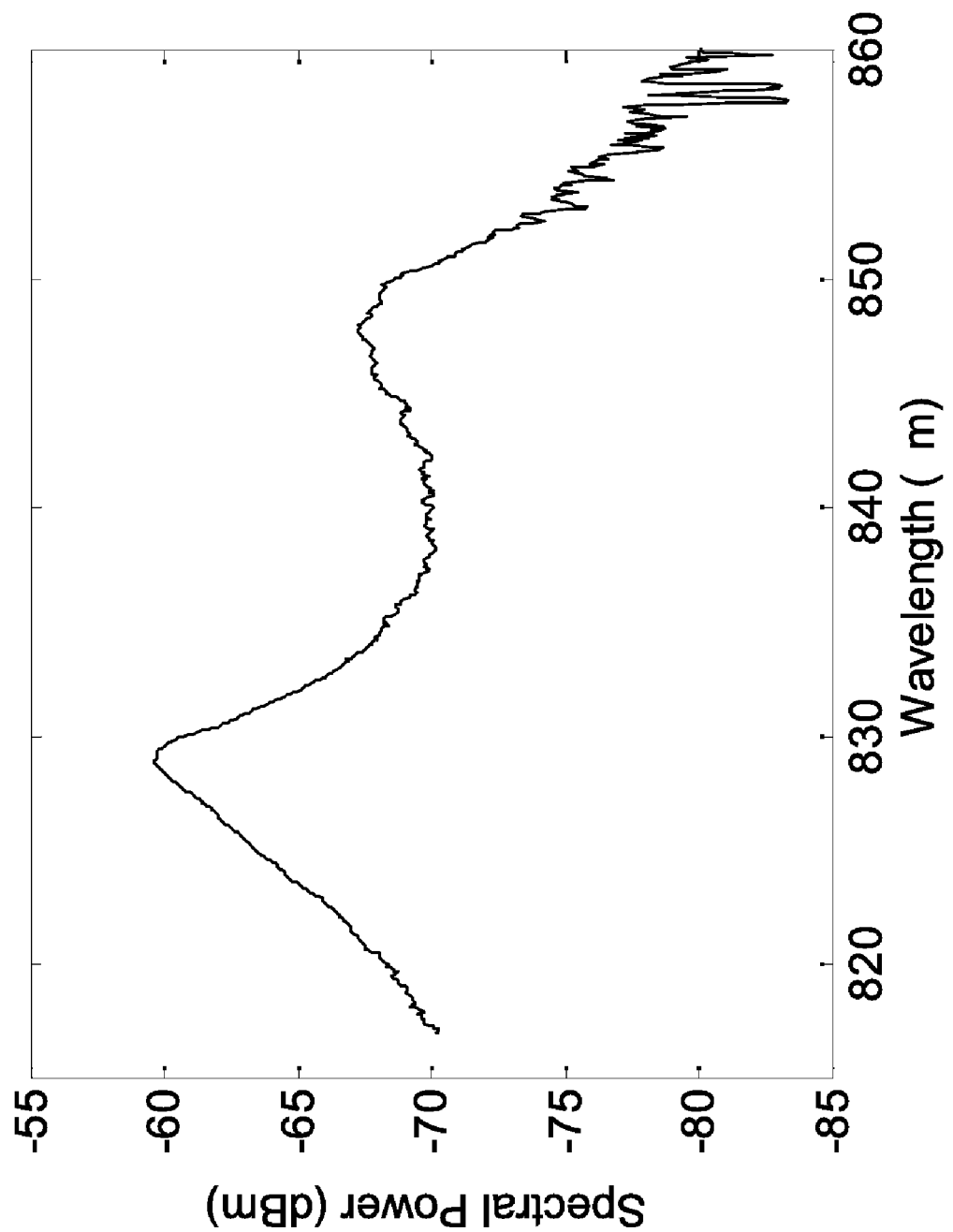
FIG. 22 is a graph of measured spectrum for the VCSEL of FIG. 17 without the SWG top reflector.

FIG. 22 shows by way of comparison, the measured emission spectrum for a half-VCSEL (without the SWG structure). The emission for this device is strongly dominated by spontaneous emission from the active region, indicating that the four pairs of fixed p-DBR are unable to provide sufficient reflectivity for lasing. Two peaks were observed in the spectrum, revealing a 20 nm mismatch of the QW gain peak (blue side) and the cavity resonance mode (red side), and the magnitude of gain peak is >10 dB larger than that of the cavity resonance mode.

The SWG-VCSEL devices described herein are achieved by integrating sub-wavelength grating with vertical cavity surface emitting laser. The high reflectivity of SWG has been experimentally demonstrated as well as the feasibility of monolithic integration with optoelectronic devices. It will be appreciated that alternative designs can be implemented which incorporate two SWG as the top and bottom mirrors with a cavity layer in-between the two highly reflective SWG mirrors. The use of SWG would provide numerous benefits when fabricating a wide range of optical devices, in particular it is particularly well-suited for use in fabricating blue-green or 1.3 μm-1.55 μm VCSEL devices, and a variety of MEMS tunable photonic devices Example Alternatives The previous section demonstrated the feasibility of using SWG to form a VCSEL optical resonant cavity, such as where the material system chosen is GaAs/AlGaAs for 850 nm near-IR VCSEL. However, the utilization of SWG can be readily extended for use in VCSELs operating at different wavelengths and in which the SWG could be comprised of different material systems. Below are some possible device structures whose embodiments can benefit from incorporating SWG as its optical cavity for a number of different wavelength regimes.

For VCSELs centered at 1.3 μm, an example embodiment can be created with an active region of GaInNAs quantum wells, InGaAs quantum dots, or GaAsSb quantum wells. The typical DBRs used for these VCSEL consists of GaAs/AlAs layers, since the epitaxial layers are grown to lattice match the GaAs substrate. Therefore, an SWG reflector for VCSEL at 1.3 μm can be very similar to that of 850 nm VCSEL described in a previous section.

For VCSELs centered at 1.55 μm, an example embodiment can be created with an InP substrate used in combination with conventional InGaAs or InGaAlAs strained quantum wells as the active region. An example of such InP-based 1.55 μm VCSEL design consisting of bottom and top DBRs are InGa(Al)As/InAlAs and dielectric/Au, respectively. Strained InGa(Al)As QWs were grown on top of the bottom n-doped DBR, all lattice matched to an InP substrate. For this particular example, SWG can be utilized in place of dielectric/Au DBR.

For semiconductor lasers operating around the visible blue-green or UV wavelength ranges, embodiments can be created in which the active region mainly comprises GaN, or InGaN, on sapphire substrate. The realization of VCSEL at these wavelengths currently favors the use of DBR materials (AlN/GaN) which possess a high quality growth capability while providing a reasonable refractive index contrast. Thus, GaN-based SWG can be potentially used as the optical cavity for VCSEL operating in this wavelength regime.

Pulsed and CW optically pumped VCSEL emitting at mid-wave IR (MWIR) of 3-5 μm has been recently demonstrated for the present invention. An embodiment can be implemented with an active region consisting of type-II multiple coupled quantum wells consisting of Al(In)Sb, InAs, and Ga(In)Sb layers with a plurality of cascaded stages, such as ranging from 15 to 28 stages. The optical cavity is formed by a semiconductor bottom DBR (GaSb/AlAsSb) mirror and dielectric (Si/SiO$_2$) top mirror. However, the fabrication of bottom DBR is limited by its thickness. For example, 12 pairs of DBR would require 6 μm of epitaxy growth, yet provide a reflectivity of only about 95-98%. Thus, a GaSb-based SWG can be potentially used to form the VCSEL optical cavity at MWIR wavelength regime.

In considering long-wave IR (LWIR) at 8-12 μm, it should be appreciated that the research progress to-date for semiconductor surface emitting lasers at LWIR regime has remained stagnant. Highly reflective mirrors are highly desirable for fabricating devices such as optical filters and detectors at LWIR wavelengths. However, at this wavelength regime, semiconductor-based DBR is extremely difficult to fabricate because the necessary thickness scales with wavelength.

Dielectric-based DBR is also not realizable, because of significant absorption in oxides and SiNx for >~9 μm. Thus, incorporating semiconductor-based SWG (GaAs or Si) can be very beneficial with regard to fabricating highly reflective mirrors for optical cavities at MWIR wavelengths.

Furthermore, the application of SWG can be extended to a wide range of optoelectronic devices for which high reflectivity within the optical resonator cavity is beneficial. By way of example and not limitation, these devices include: semiconductor light emitting diodes, semiconductor optical filters, semiconductor optical detectors, MEMS tunable SWG-VCSEL devices, MEMS tunable SWG-filters, MEMS tunable SWG-detectors, and so forth and combinations thereof.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art. All structural, chemical, and functional equivalents to the elements of the above-described preferred embodiment that are known to those of ordinary skill in the art are expressly incorporated herein by reference. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A vertical-cavity surface emitting laser device, comprising:
   a first sub-wavelength grating (SWG) reflector configured with a plurality of periodically spaced segments of high refractive index material over a layer of low refractive index material forming a first reflector;
   a first distributed Bragg reflector (DBR) configured with a plurality of alternating layers of high and low refractive index materials;
   said first distributed Bragg reflector retained substantially parallel to said first reflector to form a second reflector;
   a resonant cavity of predetermined depth formed between said first reflector and said second reflector;
   means for optical confinement between said first and second reflectors; and
   means for receiving current injection.

2. The vertical-cavity surface emitting laser device as recited in claim 1, further comprising means for changing the distance between said first sub-wavelength grating and said first distributed Bragg reflector to form a wavelength variable vertical-cavity surface emitting laser device.

3. The vertical-cavity surface emitting laser device as recited in claim 1, further comprising at least one reflective protective layer between said first sub-wavelength grating reflector and said resonant cavity.

4. The vertical-cavity surface emitting laser device as recited in claim 3, wherein said reflective protective layer comprises a second distributed Bragg reflector comprising fewer layers than said first distributed Bragg reflector.

5. The vertical-cavity surface emitting laser device as recited in claim 3, wherein said reflective protective layer comprises a second distributed Bragg reflector which is p-doped in the case of the first distributed Bragg reflector being n-doped, or n-doped in the case of the first distributed Bragg reflector being p-doped.

6. The vertical-cavity surface emitting laser device as recited in claim 1, wherein said means for current injection comprises a first contact electrode coupled to said second distributed Bragg reflector or said first sub-wavelength grating, and a second contact electrode coupled to said first distributed Bragg reflector.

7. The vertical-cavity surface emitting laser device as recited in claim 1, wherein said means for optical confinement comprises an in-plane aperture through a vertical portion of said resonant cavity configured to provide optical confinement.

8. The vertical-cavity surface emitting laser device as recited in claim 1, further comprising a plurality of semiconductor quantum structures within an active region that forms said resonant cavity, or within said segments of high refractive index material, or within a combination of said resonant cavity and said segments of high refractive index material.

9. The vertical-cavity surface emitting laser device as recited in claim 8, wherein said quantum structures are selected in any combination from the group of quantum elements consisting essentially of quantum wells, quantum wires and quantum dots.

10. A vertical-cavity surface emitting laser device, comprising:
    a first sub-wavelength grating (SWG) reflector configured with a plurality of periodically spaced segments of high refractive index material over a layer of low refractive index material forming a first reflector;
    a first distributed Bragg reflector (DBR) configured with a plurality of alternating layers of high and low refractive index materials;
    said first distributed Bragg reflector retained substantially parallel to said first reflector to form a second reflector;
    a resonant cavity of predetermined depth formed between said first reflector and said second reflector;
    means for optical confinement between said first and second reflectors;
    means for receiving current injection; and
    a plurality of semiconductor quantum structures disposed within an active region of said resonant cavity, or within said segments of high refractive index material, or within a combination of said resonant cavity and said segments of high refractive index material.

11. The vertical-cavity surface emitting laser device as recited in claim 10, further comprising means for changing the distance between said first sub-wavelength grating and said first distributed Bragg reflector to form a wavelength variable vertical-cavity surface emitting laser device.

12. The vertical-cavity surface emitting laser device as recited in claim 10, further comprising at least one reflective protective layer between said first sub-wavelength grating reflector and said resonant cavity.

13. The vertical-cavity surface emitting laser device as recited in claim 12, wherein said reflective protective layer comprises a second distributed Bragg reflector comprising fewer layers than said first distributed Bragg reflector.

14. The vertical-cavity surface emitting laser device as recited in claim 12, wherein said reflective protective layer comprises a second distributed Bragg reflector which is p-doped in the case of the first distributed Bragg reflector being n-doped, or n-doped in the case of the first distributed Bragg reflector being p-doped.

15. The vertical-cavity surface emitting laser device as recited in claim 10, wherein said means for current injection comprises a first contact electrode coupled to said second distributed Bragg reflector or said first sub-wavelength grating, and a second contact electrode coupled to said first distributed Bragg reflector.

16. The vertical-cavity surface emitting laser device as recited in claim 10, wherein said means for optical confinement comprises an in-plane aperture through a vertical portion of said resonant cavity configured to provide optical confinement.

17. The vertical-cavity surface emitting laser device as recited in claim 10, wherein said quantum structures are selected in any combination from the group of quantum elements consisting essentially of quantum wells, quantum wires and quantum dots.

18. A vertical-cavity surface emitting laser device, comprising:
- a first sub-wavelength grating (SWG) reflector configured with a plurality of periodically spaced segments of high refractive index material over a layer of low refractive index material forming a first reflector;
- a first distributed Bragg reflector (DBR) configured with a plurality of alternating layers of high and low refractive index materials;
- said first distributed Bragg reflector retained substantially parallel to said first reflector to form a second reflector;
- a resonant cavity of predetermined depth formed between said first reflector and said second reflector;
- means for optical confinement between said first and second reflectors;
- means for receiving current injection; and
- means for changing the distance between said first sub-wavelength grating and said first distributed Bragg reflector to form a wavelength variable vertical-cavity surface emitting laser device.

19. The vertical-cavity surface emitting laser device as recited in claim 18, further comprising a plurality of semiconductor quantum structures within an active region that forms said resonant cavity, or within said segments of high refractive index material, or within a combination of said resonant cavity and said segments of high refractive index material.

20. The vertical-cavity surface emitting laser device as recited in claim 19, wherein said quantum structures are selected in any combination from the group of quantum elements consisting essentially of quantum wells, quantum wires and quantum dots.

* * * * *